US010353000B2

(12) United States Patent
Yoon et al.

(10) Patent No.: US 10,353,000 B2
(45) Date of Patent: Jul. 16, 2019

(54) MULTI-BIT FLIP-FLOPS

(71) Applicant: SAMSUNG ELECTRONICS CO., LTD., Suwon-si, Gyeonggi-do (KR)

(72) Inventors: Doo-Seok Yoon, Suwon-si (KR); Min-Su Kim, Hwaseong-si (KR); Chung-Hee Kim, Yongin-si (KR); Dae-Seong Lee, Busan (KR); Hyun Lee, Incheon (KR); Matthew Berzins, Austin, TX (US); James Lim, Austin, TX (US)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 133 days.

(21) Appl. No.: 15/479,310

(22) Filed: Apr. 5, 2017

(65) Prior Publication Data

US 2017/0292993 A1 Oct. 12, 2017

Related U.S. Application Data

(60) Provisional application No. 61/319,347, filed on Apr. 7, 2016.

(30) Foreign Application Priority Data

Jun. 21, 2016 (KR) .......................... 10-2016-0077548

(51) Int. Cl.
*G01R 31/3177* (2006.01)
*H03K 3/037* (2006.01)
*G01R 31/317* (2006.01)

(52) U.S. Cl.
CPC ..... *G01R 31/3177* (2013.01); *G01R 31/31723* (2013.01); *G01R 31/31725* (2013.01); *H03K 3/0372* (2013.01)

(58) Field of Classification Search
CPC .......... G01R 31/3177; G01R 31/31725; G01R 31/31723; H03K 3/0372
See application file for complete search history.

(56) References Cited

U.S. PATENT DOCUMENTS

| 6,794,898 | B2 | 9/2004 | Komaki |
| 7,109,747 | B1 | 9/2006 | Pasqualini |
| 7,712,002 | B2 | 5/2010 | Baba |
| 8,471,597 | B2 | 6/2013 | Wang et al. |
| 8,484,523 | B2 | 7/2013 | Ramaraju et al. |

(Continued)

*Primary Examiner* — April Y Blair
*Assistant Examiner* — Rong Tang
(74) *Attorney, Agent, or Firm* — Volentine, Whitt & Francos, PLLC

(57) ABSTRACT

A multi-bit flip-flop includes: a single scan input pin to receive a scan input signal, a plurality of data input pins to receive first and second data input signals, a first scan flip-flop to select one of the scan input signal and the first data input signal as a first selection signal in response to a scan enable signal and to latch the first selection signal to provide a first output signal, a second scan flip-flop to select one of an internal signal corresponding to the first output signal and the second data input signal as a second selection signal in response to the scan enable signal and to latch the second selection signal to provide a second output signal, and a plurality of output pins to output the first and second output signals, wherein scan paths of the first and second scan flip-flops are connected to each other.

20 Claims, 26 Drawing Sheets

(56) References Cited

U.S. PATENT DOCUMENTS

| | | |
|---|---|---|
| 8,880,965 B2 | 11/2014 | Zhang et al. |
| 9,110,141 B2 | 8/2015 | Lin et al. |
| 2003/0070128 A1 | 4/2003 | Akasaka et al. |
| 2011/0239069 A1* | 9/2011 | Ramaraju ............. G06F 11/267 714/731 |
| 2011/0254588 A1* | 10/2011 | Nacer ........................ G06F 1/04 326/40 |
| 2014/0129887 A1* | 5/2014 | Lin ................ G01R 31/318541 714/729 |
| 2015/0318845 A1* | 11/2015 | Pasternak .......... H03K 3/35625 327/203 |

* cited by examiner

MULTI-BIT FLIP-FLOPS

CROSS-REFERENCE TO RELATED APPLICATION

This application claims the benefits of U.S. Provisional Application No. 62/319,347, filed on Apr. 7, 2016, in the United States Patents and Trademark Office, and Korean Patent Application No. 10-2016-0077548, filed on Jun. 21, 2016, in the Korean Intellectual Property Office, the disclosures of which are incorporated herein by reference in their entireties.

BACKGROUND

The inventive concept relates to a flip-flop, and more particularly, to a multi-bit flip-flop.

A multi-bit flip-flop, in which two or more flip-flops are implemented with a single cell, has been proposed according to the high degree of integration of semiconductor chips. A design for testability (DFT) has been widely used to maintain the quality of semiconductor chips and improve test efficiency, and a scan test technique of DFT techniques is valuable.

SUMMARY

According to an aspect of the inventive concept, there is provided a multi-bit flip-flop including: a single scan input pin configured to receive a scan input signal; a plurality of data input pins configured to respectively receive at least first and second data input signals; a first scan flip-flop configured to select one of the scan input signal and the first data input signal as a first selection signal in response to a scan enable signal, and to latch the first selection signal to provide a first output signal; a second scan flip-flop configured to select one of an internal signal corresponding to the first output signal and the second data input signal as a second selection signal in response to the scan enable signal, and to latch the second selection signal to provide a second output signal; and a plurality of output pins configured to respectively output the first and second output signals, wherein scan paths of the first and second scan flip-flops are connected to each other.

According to another aspect of the inventive concept, there is provided a multi-bit flip-flop including: a single negative scan input pin configured to receive a negative scan input signal; a plurality of data input pins configured to respectively receive at least first and second data input signals; a first scan flip-flop configured to select one of an internal scan input signal and the first data input signal as a first selection signal in response to a scan enable signal, and to latch the first selection signal to provide a first negative output signal; a second scan flip-flop configured to select one of an internal signal corresponding to the first negative output signal and the second data input signal as a second selection signal in response to the scan enable signal, and to latch the second selection signal to provide a second negative output signal; and a plurality of negative output pins configured to respectively output the first and second negative output signals, wherein scan paths of the first and second scan flip-flops are connected to each other.

According to another aspect of the inventive concept, there is provided a multi-bit flip-flop including: a first scan flip-flop configured to select one of a scan input signal and a first data input signal as a first selection signal in response to a scan enable signal, and to latch the first selection signal to provide a first output signal; and a second scan flip-flop configured to select one of an internal signal corresponding to the first output signal and a second data input signal as a second selection signal in response to the scan enable signal, and to latch the second selection signal to provide a second output signal, wherein data paths of the first and second scan flip-flops are separated from each other, and scan paths of the first and second scan flip-flops are connected to each other.

Accordingly to yet another aspect of the inventive concept, a multi-bit flip-flop, comprises: a first scan flip-flop configured to receive a first data input signal and to receive a scan input signal, and to latch a first output signal which is responsive to a first selected one of the first data input signal and the scan input signal, wherein the first scan flip-flop is configured to select the first selected one of the first data input signal and the scan input signal in response to a scan enable signal; and a second scan flip-flop configured to receive a second data input signal and to receive an internal signal corresponding to the first output signal, and to latch a second output signal which is responsive to a second selected one of the second data input signal and the internal signal corresponding to the first output signal, wherein the second scan flip-flop selects the second selected one of the second data input signal and the internal signal corresponding to the first output signal in response to the scan enable signal.

BRIEF DESCRIPTION OF THE DRAWINGS

Embodiments of the inventive concept will be more clearly understood from the following detailed description taken in conjunction with the accompanying drawings.

DETAILED DESCRIPTION OF THE EMBODIMENTS

Figure 1:
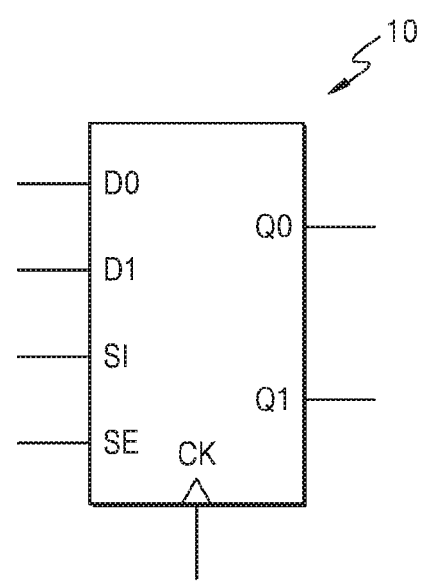
FIG. 1 is a logic symbol of an embodiment of a multi-bit flip-flop.

FIG. 1 is a logic symbol of an embodiment of a multi-bit flip-flop 10.

Referring to FIG. 1, multi-bit flip-flop 10 may receive first and second data input signals D0 and D1 and a scan input signal SI, and may select the first and second data input signals D0 and D1 or the scan input signal SI in response to a scan enable signal SE. Multi-bit flip-flop 10 may latch a selected signal in response to a clock signal CK and provide first and second output signals Q0 and Q1.

In the present embodiment, multi-bit flip-flop 10 may receive two data input signals, i.e., the first and second data input signals D0 and D1, and provide two output signals, i.e., the first and second output signals Q0 and Q1. However, the inventive concept is not limited thereto, and in some embodiments, multi-bit flip-flop 10 may receive N data input signals and provide N output signals (where N is an integer that is equal to or greater than 2). In some embodiments, multi-bit flip-flop 10 may receive a single scan input signal SI regardless of the number of data input signals. Accordingly, multi-bit flip-flop 10 may be referred to as a multi-bit single scan-in flip-flop.

The scan enable signal SE may indicate a first operation mode or a second operation mode, depending on a logic level thereof. In detail, the scan enable signal SE may indicate the first operation mode when the scan enable signal SE is at a first logic level (e.g., a logic low level), and may indicate the second operation mode when the scan enable signal SE is at a second logic level (e.g., a logic high level). For example, the first operation mode may be a normal operation mode for performing data transmission, and the second operation mode may be a scan test mode for performing a test operation. However, this is only an example, and in other examples, the first operation mode may be a scan test mode and the second operation mode may be a normal operation mode.

When the scan enable signal SE indicates a normal operation mode, multi-bit flip-flop 10 may perform a normal operation for latching the first and second data input signals D0 and D1 and provide the first and second output signals Q0 and Q1. In the present embodiment, the first and second data input signals D0 and D1 may be respectively received through two input pins, and the first and second output signals Q0 and Q1 may be respectively output through two output pins. In this case, the first output signal Q0 may correspond to the first data input signal D0, and the second output signal Q1 may correspond to the second data input signal D1. According to an embodiment, the polarities of the first and second data input signals D0 and D1 may be the same as those of the first and second output signals Q0 and Q1.

When the scan enable signal SE indicates a scan test mode, multi-bit flip-flop 10 may perform a scan operation for latching the scan input signal SI. In the present embodiment, the scan input signal SI may be received through one input pin, and scan paths of two flip-flops in multi-bit flip-flop 10 may be connected to each other. In this case, an internal signal corresponding to the first output signal Q0 of one flip-flop of multi-bit flip-flop 10 may be used as a next scan input signal for another flip-flop of multi-bit flip flop 10. In this manner, multi-bit flip-flop 10 may be a single scan-in flip-flop that receives a single scan input signal SI. According to an embodiment, the polarity of the scan input signal SI may be the same as those of the first and second output signals Q0 and Q1.

Figure 2:
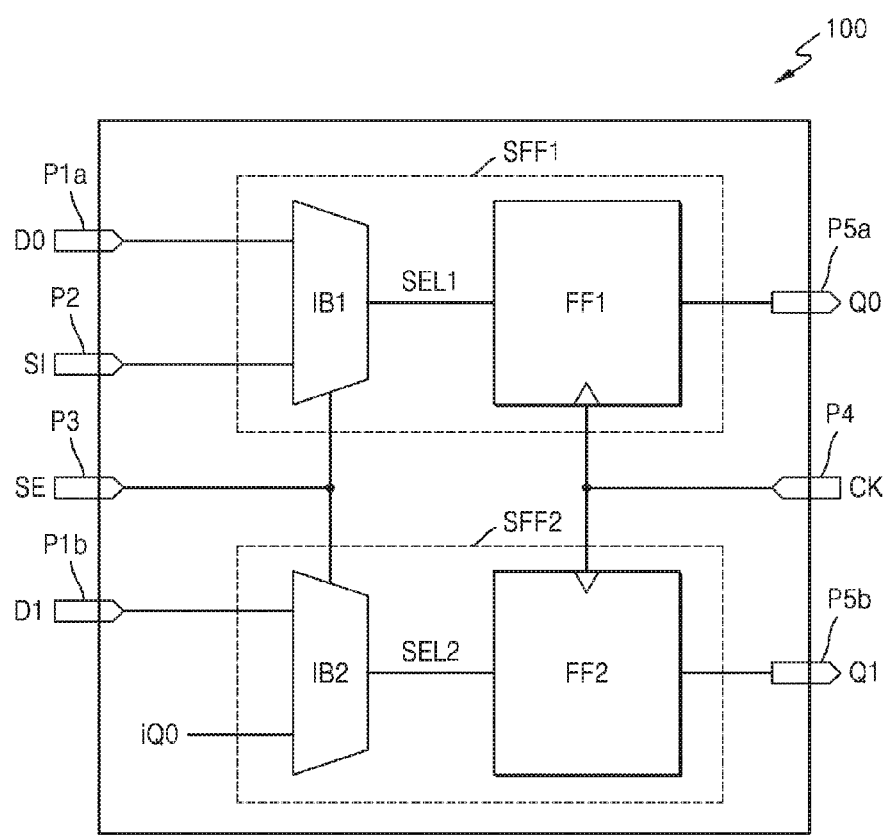
FIG. 2 is a block diagram of an embodiment of a multi-bit flip-flop.

FIG. 2 is a block diagram of an embodiment of a multi-bit flip-flop 100.

Referring to FIG. 2, multi-bit flip-flop 100 may include first and second scan flip-flops SFF1 and SFF2, and may be implemented with a single cell. Although multi-bit flip-flop 100 may be implemented with a single cell including three or more scan flip-flops, an embodiment in which multi-bit flip-flop 100 includes two scan flip-flops, i.e., the first and second scan flip-flops SFF1 and SFF2, will be described below for convenience of description.

Multi-bit flip-flop 100 may include a plurality of pins for transmitting a signal input to multi-bit flip-flop 100 to the inside thereof, or for transmitting a signal output from multi-bit flip-flop 100 to the outside thereof. Each of the pins may include a conductor, and may be referred to as a terminal. In the present embodiment, multi-bit flip-flop 100 may include first and second data input pins P1a and P1b, a scan input pin P2, a scan enable input pin P3, a clock input pin P4, and first and second output pins P5a and P5b.

In detail, the first and second data input pins P1a and P1b may respectively receive first and second data input signals D0 and D1, the scan input pin P2 may receive a scan input signal SI, the scan enable input pin P3 may receive a scan enable signal SE, the clock input pin P4 may receive a clock signal CK, and the first and second output pins P5a and P5b may respectively output first and second output signals Q0 and Q1. According to the present embodiment, as multi-bit flip-flop 100 includes a single scan input pin P2, the degree of freedom of a circuit design may be improved, compared to a case in which a multi-bit flip-flop includes a plurality of scan input pins.

The first scan flip-flop SFF1 may include a first input block IB1 and a first flip-flop FF1. The first input block IB1 may receive the first data input signal D0 and the scan input signal SI, and may select one of the first data input signal D0 and the scan input signal SI as a first selection signal SEL1 in response to the scan enable signal SE. The first flip-flop FF1 may receive the first selection signal SEL1, and may latch the first selection signal SEL1 in response to the clock signal CK and provide the first output signal Q0 in correspondence to the first selection signal SEL1.

The second scan flip-flop SFF2 may include a second input block IB2 and a second flip-flop FF2. The second input block IB2 may receive the second data input signal D1 and an internal signal iQ0, and may select one of the second data input signal D1 and the internal signal iQ0 as a second selection signal SEL2 in response to the scan enable signal SE. The second flip-flop FF2 may receive the second selection signal SEL2, and may latch the second selection signal SEL2 in response to the clock signal CK and provide the second output signal Q1 in correspondence to the second selection signal SEL2.

In an embodiment, the internal signal iQ0 may be a signal obtained in correspondence to the first output signal Q0. In an embodiment, the internal signal iQ0 may have the same logic level as the first output signal Q0. However, the inventive concept is not limited thereto, and in some embodiments, the internal signal iQ0 may have a logic level corresponding to the inversion of the logic level of the first output signal Q0. In an embodiment, the internal signal iQ0 may be generated by the first scan flip-flop SFF1. More details will be described with reference to FIGS. 3A and 3B.

Figure 3A:
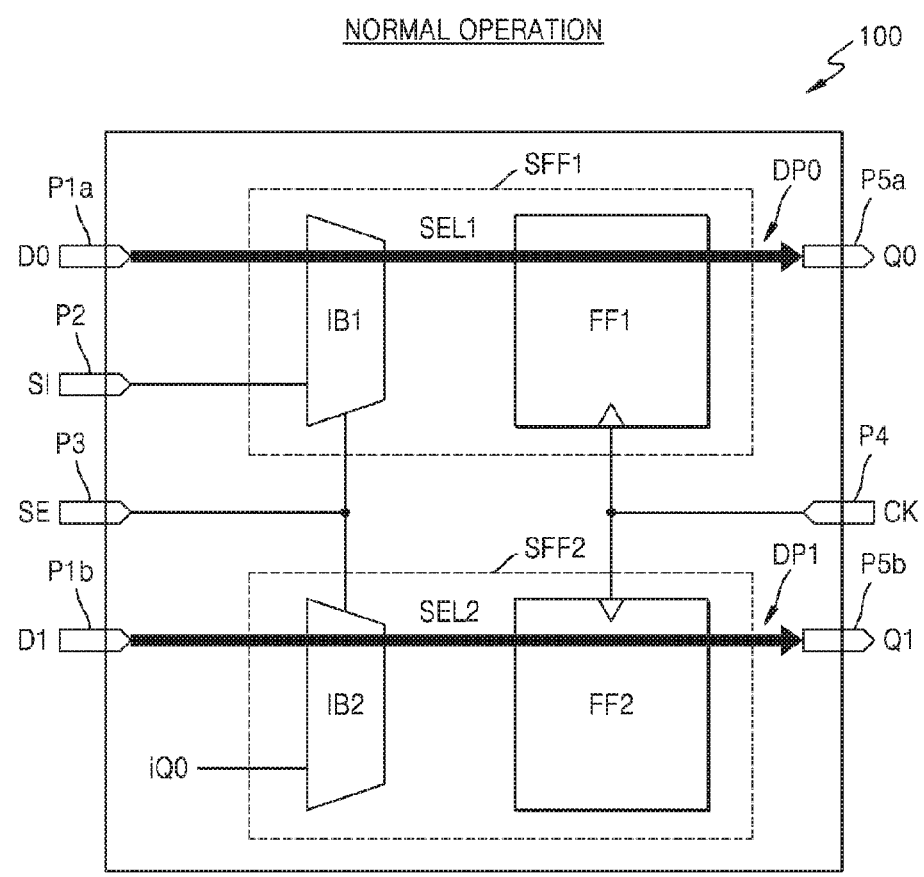
FIG. 3A shows data paths of the multi-bit flip-flop of FIG. 2.
Figure 3B:
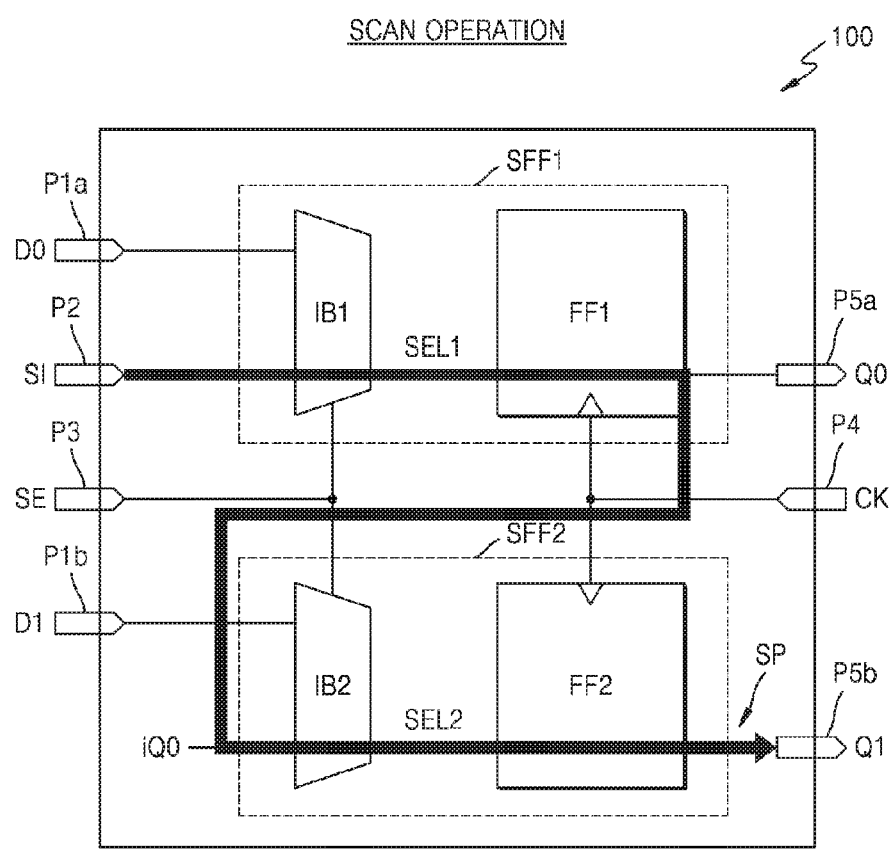
FIG. 3B shows a scan path of the multi-bit flip-flop of FIG. 2.

FIG. 3A shows first and second data paths DP0 and DP1 of multi-bit flip-flop 100 of FIG. 2, and FIG. 3B shows a scan path SP of multi-bit flip-flop 100 of FIG. 2.

Referring to FIG. 3A, when the scan enable signal SE indicates a normal operation mode, the first and second data paths DP0 and DP1 may be generated by multi-bit flip-flop 100. Specifically, when the scan enable signal SE has a first logic level, the first input block IB1 may select the first data input signal D0 as the first selection signal SEL1, and the first flip-flop FF1 may latch the first selection signal SEL1 and provide the first output signal Q0. In addition, when the scan enable signal SE has the first logic level, the second input block IB2 may select the second data input signal D1 as the second selection signal SEL2, and the second flip-flop FF2 may latch the second selection signal SEL2 and provide the second output signal Q1.

According to the present embodiment, when the scan enable signal SE has the first logic level, that is, when multi-bit flip-flop 100 is in a normal operation mode, the polarities of the first and second output signals Q0 and Q1 are the same as those of the first and second data input signals D0 and D1. However, the inventive concept is not limited thereto, and in some embodiments, the polarities of the first and second output signals Q0 and Q1 may be respectively different (i.e., inverted) from those of the first and second data input signals D0 and D1.

Referring to FIG. 3B, when the scan enable signal SE indicates a scan test mode, a single scan path SP may be generated by multi-bit flip-flop 100. Specifically, when the scan enable signal SE has a second logic level, the first input block IB1 may select the scan input signal SI as the first selection signal SEL1, and the first flip-flop FF1 may latch the first selection signal SEL1 and provide the first output signal Q0 in correspondence to the first selection signal SEL1. In an embodiment, the first flip-flop FF1 may generate the internal signal iQ0 by mirroring the first output signal Q0, and may provide the generated internal signal iQ0 to the second input block IB2. In addition, when the scan enable signal SE has the second logic level, the second input block IB2 may select the internal signal iQ0 as the second selection signal SEL2, and the second flip-flop FF2 may latch the second selection signal SEL2 and provide the second output signal Q1 in correspondence to the second selection signal SEL2.

According to the present embodiment, when the scan enable signal SE has the second logic level, that is, when multi-bit flip-flop 100 is in a scan test mode, the polarities of the first and second output signals Q0 and Q1 are the same as that of the scan input signal SI. However, the inventive concept is not limited thereto, and in some embodiments, the polarities of the first and second output signals Q0 and Q1 may be different from that of the scan input signal SI.

According to the present embodiment, as a scan path of the first scan flip-flop SFF1 and a scan path of the second scan flip-flop SFF2 are connected to each other in this manner, the single scan path SP may be generated. In detail, an internal signal iQ0 having the same logic level as the first output signal Q0 of the first scan flip-flop SFF1 may be used as a scan input signal of the second scan flip-flop SFF2. Accordingly, multi-bit flip-flop 100 may operate substantially similar to a scan chain including a plurality of scan flip-flops, respectively implemented with a plurality of cells. According to the present embodiment, a cell size may be reduced compared to a case of a scan chain in which a plurality of scan flip-flops are implemented with a plurality of cells and the plurality of cells are connected to each other.

When the scan path of the first scan flip-flop SFF1 and the scan path of the second scan flip-flop SFF2 are not connected to each other in multi-bit flip-flop 100, an additional circuit for receiving the first output signal Q0 through the first output pin P5a and inputting the received first output signal Q0 to the second scan flip-flop SFF2 through a second scan input pin is required. For example, an additional cell area has to be allocated to implement an additional circuit such as a scan buffer, and power consumption for driving the additional circuit is needed. However, according to the present embodiment, an additional cell area and power consumption may be reduced by connecting the scan path of the first scan flip-flop SFF1 and the scan path of the second scan flip-flop SFF2 in multi-bit flip-flop 100.

Figure 4:
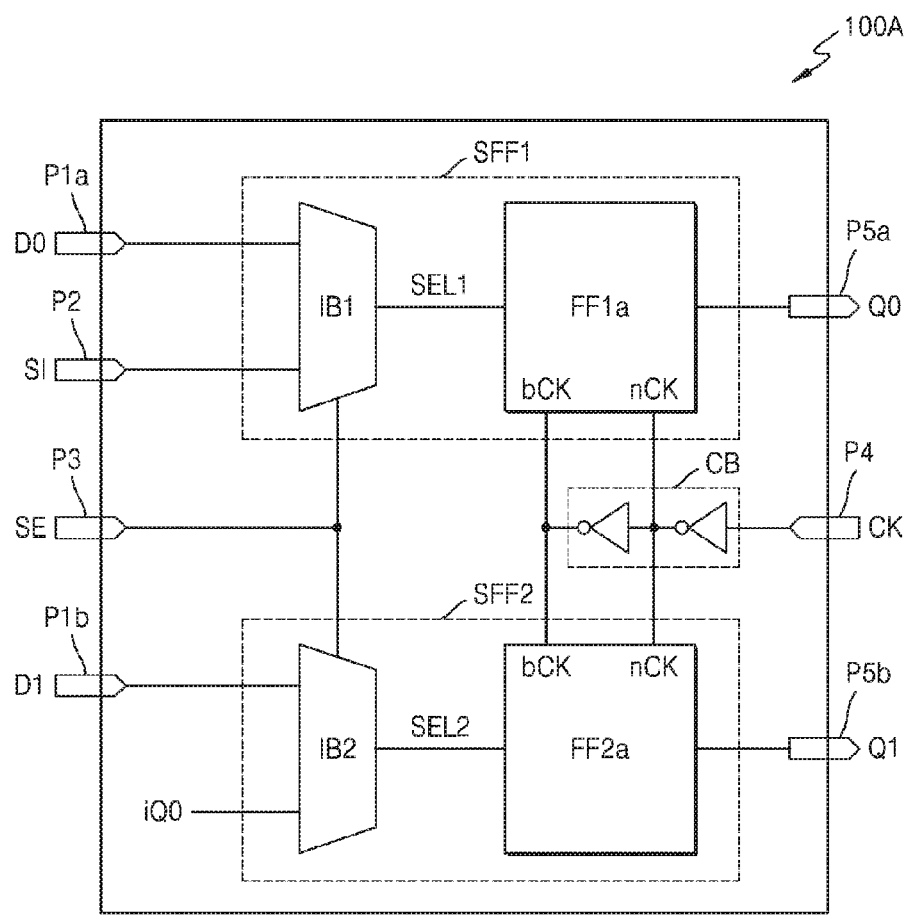
FIG. 4 is a block diagram of an embodiment of a multi-bit flip-flop.

FIG. 4 is a block diagram of an embodiment of a multi-bit flip-flop 100A.

Referring to FIG. 4, multi-bit flip-flop 100A may include first and second scan flip-flops SFF1 and SFF2 and a clock buffer CB. Multi-bit flip-flop 100A according to the present embodiment corresponds to an implementation example of multi-bit flip-flop 100 of FIG. 2, and descriptions provided with reference to FIGS. 2, 3A and 3B may be applied to the present embodiment. In detail, multi-bit flip-flop 100A may further include a clock buffer CB, compared to multi-bit flip-flop 100 of FIG. 2.

The clock buffer CB may receive a clock signal CK, and may buffer the received clock signal CK and drive first and second flip-flops FF1a and FF2a. In the present embodiment, the clock buffer CB may receive the clock signal CK and provide an inverted clock signal nCK and a buffered clock signal bCK. Accordingly, the first and second flip-flops FF1a and FF2a may respectively latch first and second selection signals SEL1 and SEL2 in response to the inverted clock signal nCK and the buffered clock signal bCK.

When processing a plurality of data input signals by using a plurality of single bit flip-flops, the size and power consumption of an integrated circuit including the plurality of single bit flip-flops increase since each of the single bit flip-flops is implemented with a cell including a clock buffer. However, according to the present embodiment, the size and power consumption of multi-bit flip-flop 100A may be reduced since multi-bit flip-flop 100A is implemented with a single cell and the first and second scan flip-flops SFF1 and SFF2 may be driven by using a single clock buffer CB. An embodiment in which multi-bit flip-flop 100A is implemented will be described below with reference to FIGS. 6A and 6B.

Figure 5:
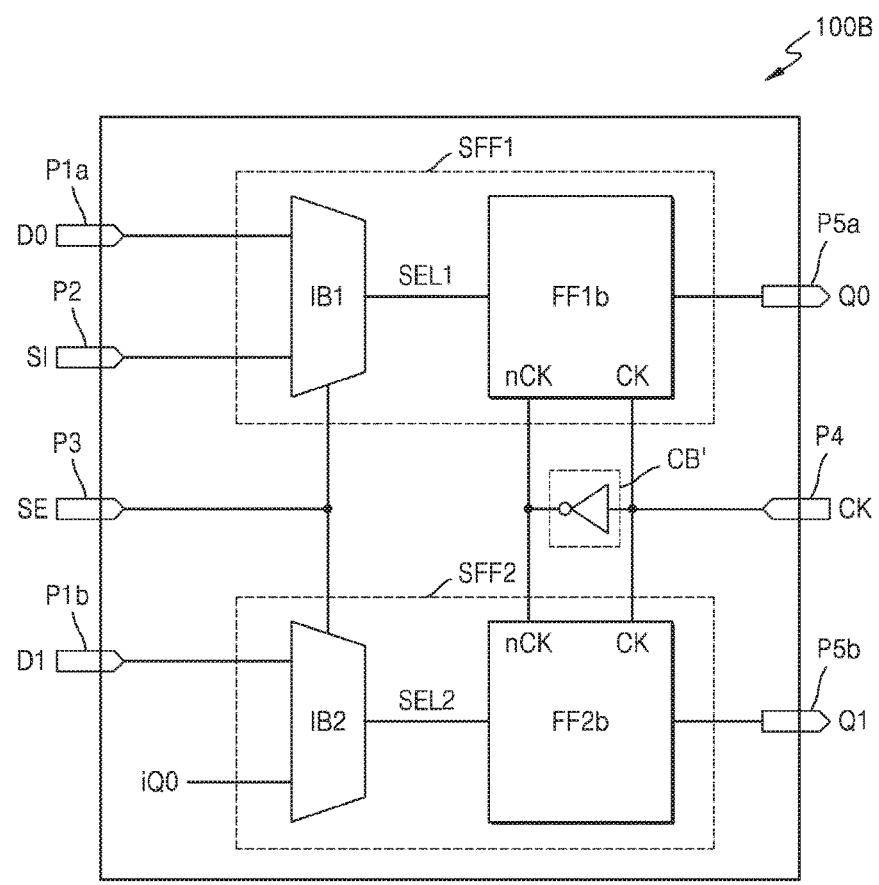
FIG. 5 is a block diagram of an embodiment of a multi-bit flip-flop.

FIG. 5 is a block diagram of an embodiment of a multi-bit flip-flop 100B.

Referring to FIG. 5, multi-bit flip-flop 100B may include first and second scan flip-flops SFF1 and SFF2 and a clock buffer CB'. Multi-bit flip-flop 100B according to the present embodiment corresponds to another implementation example of multi-bit flip-flop 100 of FIG. 2, and descriptions provided with reference to FIGS. 2, 3A and 3B may be applied to the present embodiment. In detail, multi-bit flip-flop 100B may further include the clock buffer CB', compared to the multi-bit flip-flop 100 of FIG. 2.

The clock buffer CB' may receive a clock signal CK, and may buffer the received clock signal CK and drive first and second flip-flops FF1b and FF2b. In the present embodiment, the clock buffer CB' may receive the clock signal CK and provide an inverted clock signal nCK. Accordingly, the first and second flip-flops FF1b and FF2b may respectively latch first and second selection signals SEL1 and SEL2 in response to the clock signal CK and the inverted clock signal nCK. According to the present embodiment, the size of the clock buffer CB' may be relatively smaller than the clock buffer CB, and thus, the size of a cell including multi-bit flip-flop 100B implemented therein and the power consumption thereof may be reduced.

Figure 6A:
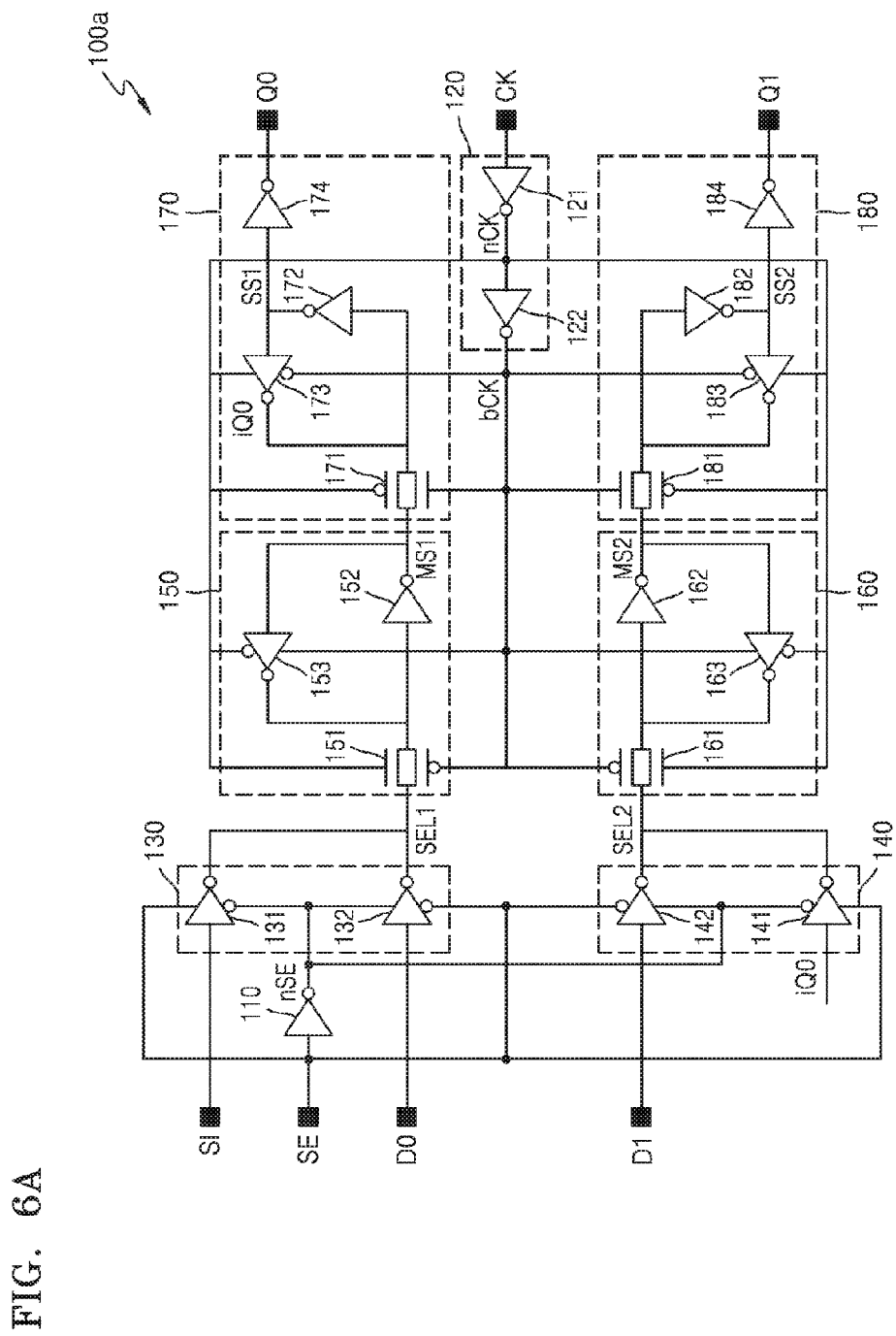
FIGS. 6A and 6B are circuit diagrams of embodiments of multi-bit flip-flops.
Figure 6B:
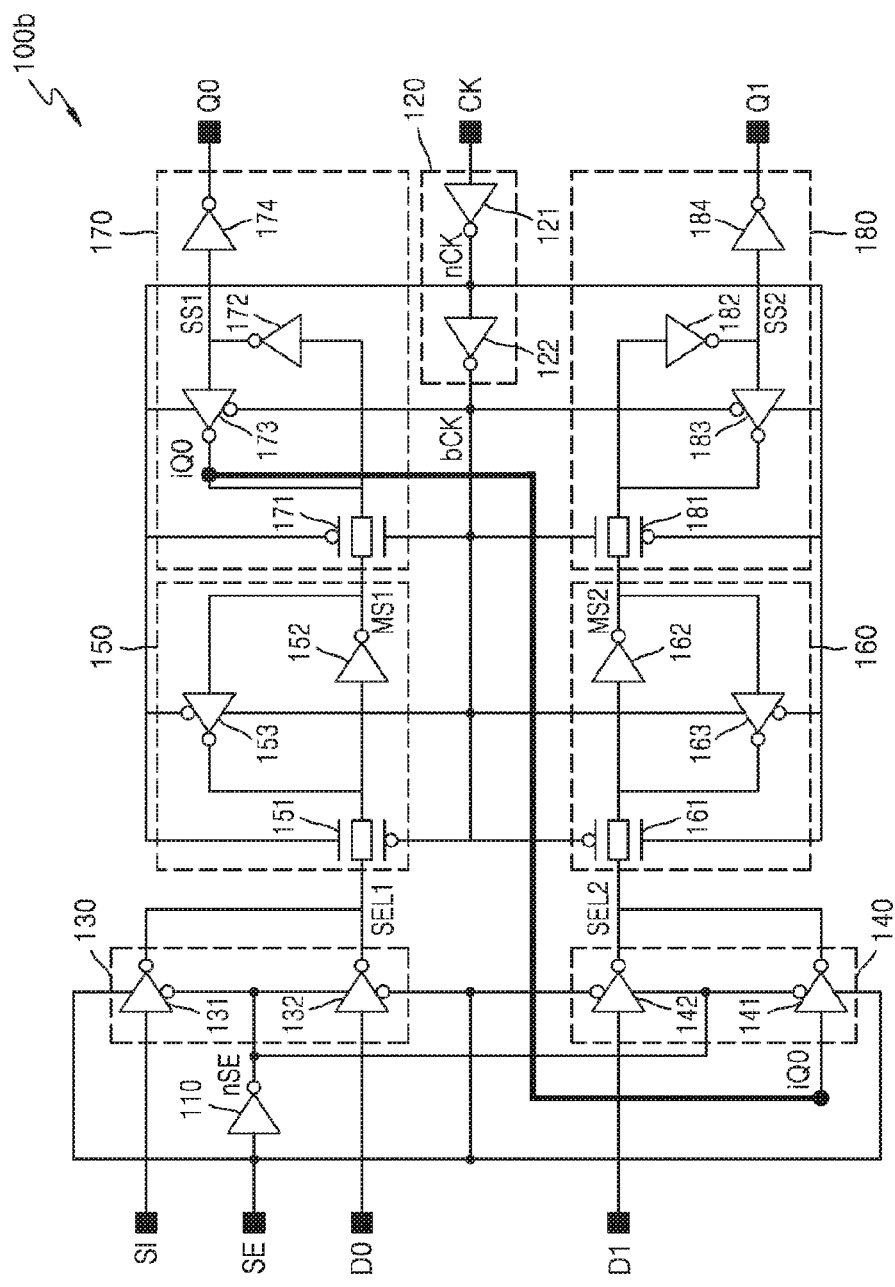

FIGS. 6A and 6B are circuit diagrams of embodiments of multi-bit flip-flops 100a and 100b, respectively.

Referring to FIG. 6A, multi-bit flip-flop 100a may include a scan enable buffer 110, a clock buffer 120, first and second input blocks 130 and 140, first and second master latches 150 and 160, and first and second slave latches 170 and 180. Scan enable buffer 110 may receive a scan enable signal SE, and may buffer the received scan enable signal SE and provide an inverted scan enable signal nSE. Clock buffer 120 may receive a clock signal CK, and may buffer the received clock signal CK and provide an inverted clock signal nCK and a buffered clock signal bCK. In detail, clock buffer 120 may include first and second clock inverters 121 and 122. First clock inverter 121 may receive the clock signal CK and provide the inverted clock signal nCK, and second clock inverter 122 may receive the inverted clock signal nCK and provide the buffered clock signal bCK.

First input block 130 may include first and second input tri-state inverters 131 and 132. First input tri-state inverter 131 may receive a scan input signal SI, and may output a signal, obtained by inverting the scan input signal SI, in response to the scan enable signal SE and the inverted scan enable signal nSE. Second input tri-state inverter 132 may receive a first data input signal D0, and may output a signal, obtained by inverting the first data input signal D0, in response to the scan enable signal SE and the inverted scan enable signal nSE. A first selection signal SEL1 may be one selected from an output of first input tri-state inverter 131 and an output of second input tri-state inverter 132, depending on the scan enable signal SE.

First master latch 150 may include a first transmission gate 151, a first inverter 152, and a first tri-state inverter 153. First transmission gate 151 may transmit the first selection signal SEL1 to first inverter 152, based on the clock signal CK, and more specifically, in response to the inverted clock signal nCK and the buffered clock signal bCK. First inverter 152 may invert the first selection signal SEL1 transmitted from first transmission gate 151 and provide a first master signal MS1. First tri-state inverter 153 may receive the first master signal MS1, and may output a signal, obtained by inverting the first master signal MS1, based on the clock signal CK, and more specifically, in response to the inverted clock signal nCK and the buffered clock signal bCK.

First slave latch 170 may include a second transmission gate 171, a second inverter 172, a second tri-state inverter 173, and a third inverter 174. Second transmission gate 171 may transmit an output of first master latch 170, that is, the first master signal MS1, to second inverter 172, based on the clock signal CK, and more specifically, in response to the inverted clock signal nCK and the buffered clock signal bCK. Second inverter 172 may include a first input terminal, connected to an output of second transmission gate 171, and a first output terminal, and may invert the first master signal MS1 transmitted from second transmission gate 171 to provide a first slave signal SS1. Second tri-state inverter 173 may include a second input terminal connected to the first output terminal of inverter 172, and may include a second output terminal connected to the first input terminal of inverter 172. Second tri-state inverter 173 may receive the first slave signal SS1, and may output a signal, obtained by inverting the first slave signal SS1, based on the clock signal CK, and more specifically, in response to the inverted clock signal nCK and the buffered clock signal bCK. Third inverter 174 may invert the first slave signal SS1 to provide a first output signal Q0.

In the present embodiment, an output of second tri-state inverter 173 may have the same logic level as an output of third inverter 174, that is, the first output signal Q0. Accordingly, the output signal iQ0 of second tri-state inverter 173 may be a signal obtained by mirroring the first output signal Q0. Hereinafter, the output signal iQ0 of second tri-state inverter 173 is referred to as an internal signal iQ0 corresponding to the first output signal Q0. However, the inventive concept is not limited thereto, and a signal obtained through an even number of inverters from the first output signal Q0 may be used as the internal signal iQ0.

In the present embodiment, the internal signal iQ0 output by second tri-state inverter 173 may be used as a scan input signal that is applied to second input block 140. Accordingly, a scan path passing through first input block 130, first master latch 150, and first slave latch 170 may be connected to a scan path passing through second input block 140, second master latch 160, and second slave latch 180. In some embodiments, an output of second inverter 172, that is, the first slave signal SS1, may be used as an internal signal.

Second input block 140 may include third and fourth input tri-state inverters 141 and 142. Third input tri-state inverter 141 may receive the internal signal iQ0 corresponding to the first output signal Q0, and may output a signal obtained by inverting the internal signal iQ0, in response to the scan enable signal SE and the inverted scan enable signal nSE. Fourth input tri-state inverter 142 may receive a second data input signal D1, and may output a signal, obtained by inverting the second data input signal D1, in response to the scan enable signal SE and the inverted scan enable signal nSE. A second selection signal SEL2 may be one selected from an output of third input tri-state inverter 141 and an output of fourth input tri-state inverter 142, depending on the scan enable signal SE.

Second master latch 160 may include a third transmission gate 161, a fourth inverter 162, and a third tri-state inverter 163. Third transmission gate 161 may transmit the second selection signal SEL2 to fourth inverter 162, based on the clock signal CK, and more specifically, in response to the inverted clock signal nCK and the buffered clock signal bCK. Fourth inverter 162 may invert the second selection signal SEL2 transmitted from third transmission gate 161 to provide a second master signal MS2. Third tri-state inverter 163 may receive the second master signal MS2, and may output a signal obtained by inverting the second master signal MS2, based on the clock signal CK, and more specifically, in response to the inverted clock signal nCK and the buffered clock signal bCK.

Second slave latch 180 may include a fourth transmission gate 181, a fifth inverter 182, a fourth tri-state inverter 183, and a sixth inverter 184. Fourth transmission gate 181 may transmit an output of second master latch 160, that is, the second master signal MS2, to fifth inverter 182, based on the clock signal CK, and more specifically, in response to the inverted clock signal nCK and the buffered clock signal bCK. Fifth inverter 182 may invert the second master signal MS2 transmitted from fourth transmission gate 181 to provide a second slave signal SS2. Fourth tri-state inverter 183 may receive the second slave signal SS2, and may output a signal obtained by inverting the second slave signal SS2, based on the clock signal CK, and more specifically, in response to the inverted clock signal nCK and the buffered clock signal bCK. Sixth inverter 184 may invert the second slave signal SS2 to provide a second output signal Q1.

In some embodiments, multi-bit flip-flop 100a may further include a third scan flip-flop. In this case, an output signal of fourth tri-state inverter 183 may be used as a scan input signal that is applied to the third scan flip-flop. In some embodiments, an output of fifth inverter 182, that is, the second slave signal SS2, may be used as a scan input signal that is applied to the third scan flip-flop. In some embodiments, multi-bit flip-flop 100a may be a 3-bit flip-flop, a 4-bit flip-flop, or a 5-or-more-bit flip-flop.

Referring to FIG. 6B, multi-bit flip-flop 100b may be an implementation example of multi-bit flip-flop 100a illustrated in FIG. 6A. According to the current embodiment, the output of second tri-state inverter 173 of first slave latch 170 may be electrically connected to an input of third input tri-state inverter 141 of second input block 140.

In an embodiment, the output of second tri-state inverter 173 and the input of third input tri-state inverter 141 may correspond to a single net indicating equipotentiality in an equivalent circuit diagram of multi-bit flip-flop 100b, and may correspond to a single interconnection in a layout of multi-bit flip-flop 100b. In an embodiment, the output of second tri-state inverter 173 and the input of third input tri-state inverter 141 may be electrically connected to each other through a plurality of wiring lines and at least one via.

However, the inventive concept is not limited thereto, and in some embodiments, a buffer may be connected in an electrical path between the output of second tri-state inverter 173 and the input of third input tri-state inverter 141. For example, the buffer may include two or more inverters. In other words, multi-bit flip-flop 100b may have a configuration in which a signal having the same logic level as the output of second tri-state inverter 173, that is, the internal signal iQ0, is input to third input tri-state inverter 141.

Figure 7:
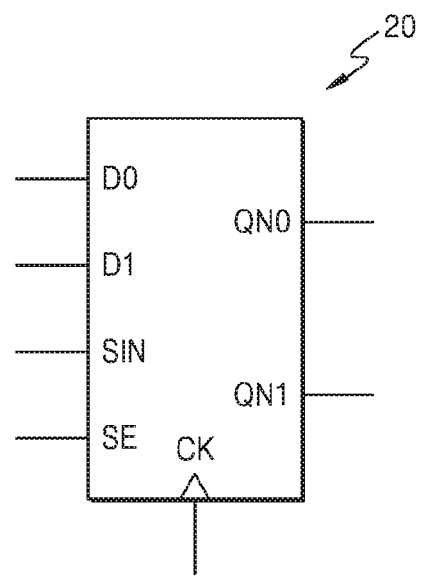
FIG. 7 is a logic symbol of an embodiment of a multi-bit flip-flop.

FIG. 7 is a logic symbol of an embodiment of a multi-bit flip-flop 20.

Referring to FIG. 7, multi-bit flip-flop 20 may receive first and second data input signals D0 and D1 and a negative scan input signal SIN, and may select the first and second data input signals D0 and D1 or the negative scan input signal SIN in response to a scan enable signal SE. Multi-bit flip-flop 20 may latch a selected signal in response to a clock signal CK and provide first and second negative output signals QN0 and QN1.

In the present embodiment, multi-bit flip-flop 20 may receive two data input signals, i.e., the first and second data input signals D0 and D1, and provide two negative output signals, i.e., the first and second negative output signals QN0 and QN1. However, the inventive concept is not limited thereto, and in some embodiments, multi-bit flip-flop 20 may receive N data input signals and provide N negative output signals (where N is an integer that is equal to or greater than 2). In some embodiments, multi-bit flip-flop 20 may receive a single negative scan input signal SIN regardless of the number of data input signals. Accordingly, multi-bit flip-flop 20 may be referred to as a multi-bit single scan-in flip-flop.

The scan enable signal SE may indicate a first operation mode or a second operation mode, depending on a logic level thereof, as explained above with respect to multi-bit flip-flop 10 of FIG. 1.

When the scan enable signal SE indicates a normal operation mode, multi-bit flip-flop 20 may perform a normal operation for latching the first and second data input signals D0 and D1 and providing the first and second negative output signals QN0 and QN1. According to the present embodiment, the polarities of the first and second data input signals D0 and D1 may be respectively different from those of the first and second negative output signals QN0 and QN1.

When the scan enable signal SE indicates a scan test mode, multi-bit flip-flop 20 may perform a scan operation for latching the negative scan input signal SIN. In the present embodiment, the negative scan input signal SIN may be received through one input pin, and scan paths of two flip-flops in multi-bit flip-flop 20 may be connected to each other. In this case, an internal signal corresponding to the first negative output signal QN0 of one flip-flop of multi-bit flip-flop 20 may be used as a next scan input signal for another flip-flop of multi-bit flip-flop 20. In this manner, multi-bit flip-flop 20 may be a single scan-in flip-flop that receives a single negative scan input signal SIN. According to the present embodiment, the polarity of the negative scan input signal SIN may be the same as those of the first and second negative output signals QN0 and QN1.

Figure 8:
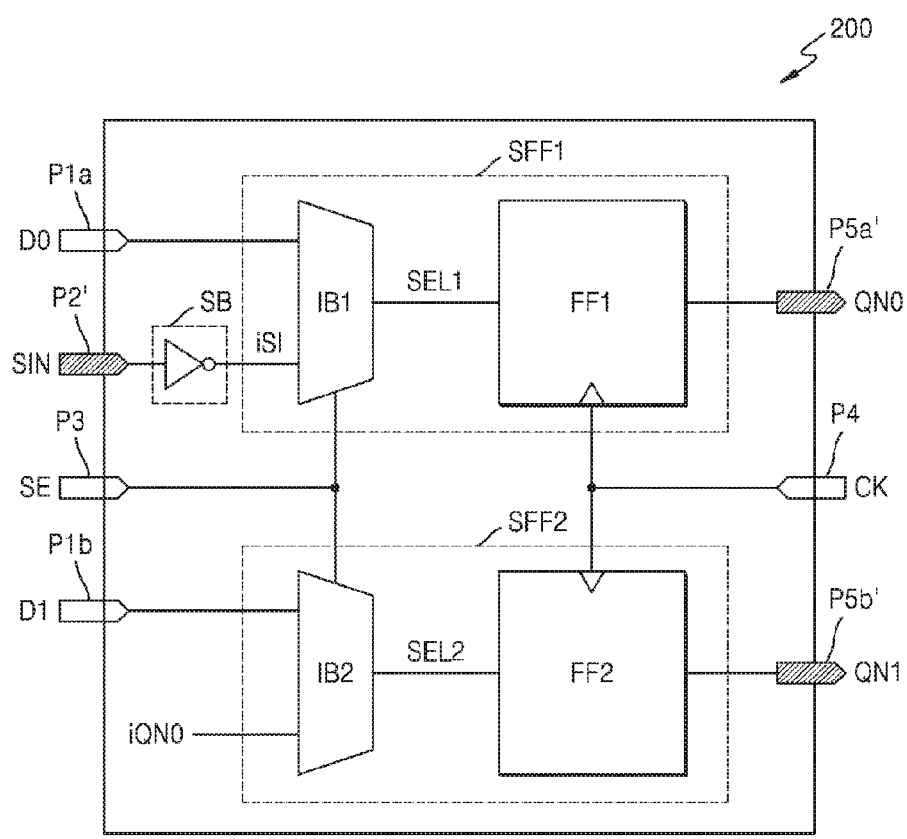
FIG. 8 is a block diagram of an embodiment of a multi-bit flip-flop.

FIG. 8 is a block diagram of an embodiment of a multi-bit flip-flop 200.

Referring to FIG. 8, multi-bit flip-flop 200 may include first and second scan flip-flops SFF1 and SFF2 and a scan input buffer SB, and may be implemented with a single cell.

In the present embodiment, multi-bit flip-flop 200 may include first and second data input pins P1a and P1b, a negative scan input pin P2', a scan enable input pin P3, a clock input pin P4, and first and second negative output pins P5a' and P5b'. According to the present embodiment, as multi-bit flip-flop 200 includes a single negative scan input pin P2', the degree of freedom of a circuit design may be improved, compared to a case in which a multi-bit flip-flop includes a plurality of negative scan input pins. In addition, according to the present embodiment, as multi-bit flip-flop 200 includes the single negative scan input pin P2', the pin polarity of multi-bit flip-flop 200 may match the pin polarity of a high speed flip-flop that is connected to multi-bit flip-flop 200 in a preceding stage. Furthermore, according to the present embodiment, as multi-bit flip-flop 200 includes the first and second negative output pins P5a' and P5b', the pin polarity of multi-bit flip-flop 200 may match the pin polarity of a high speed flip-flop that is connected to multi-bit flip-flop 200 in a subsequent stage.

The scan input buffer SB may receive a negative scan input signal SIN, and may buffer the received negative scan input signal SIN and provide an internal scan input signal iSI. The internal scan input signal iSI may be provided to a first input block IB1 included in the first scan flip-flop SFF1. However, the inventive concept is not limited thereto, and multi-bit flip-flop 200 may not include the scan input buffer SB.

The first scan flip-flop SFF1 may include the first input block IB1 and a first flip-flop FF1. The second scan flip-flop SFF2 may include a second input block IB2 and a second flip-flop FF2. The first input block IB1 may receive a first data input signal D0 and the internal scan input signal iSI, and may select one of the first data input signal D0 and the internal scan input signal iSI as a first selection signal SEL1 in response to a scan enable signal SE. The first flip-flop FF1 may receive the first selection signal SEL1, and may latch the first selection signal SEL1 in response to a clock signal CK and provide a first negative output signal QN0 in correspondence to the first selection signal SEL1. The second input block IB2 may receive a second data input signal D1 and an internal signal iQN0, and may select one of the second data input signal D1 and the internal signal iQN0 as a second selection signal SEL2 in response to the scan enable signal SE. The second flip-flop FF2 may receive the second selection signal SEL2, and may latch the second selection signal SEL2 in response to the clock signal CK and provide a second negative output signal QN1 in correspondence to the second selection signal SEL2.

In an embodiment, the internal signal iQN0 may be a signal in correspondence to the first negative output signal QN0. In an embodiment, the internal signal iQN0 may have the same logic level as the first negative output signal QN0. However, the inventive concept is not limited thereto, and in some embodiments, the internal signal iQN0 may have a logic level corresponding to the inversion of the logic level of the first negative output signal QN0. In an embodiment, the internal signal iQN0 may be generated by the first scan flip-flop SFF1. More details will be described with reference to FIGS. 9A and 9B.

Figure 9A:
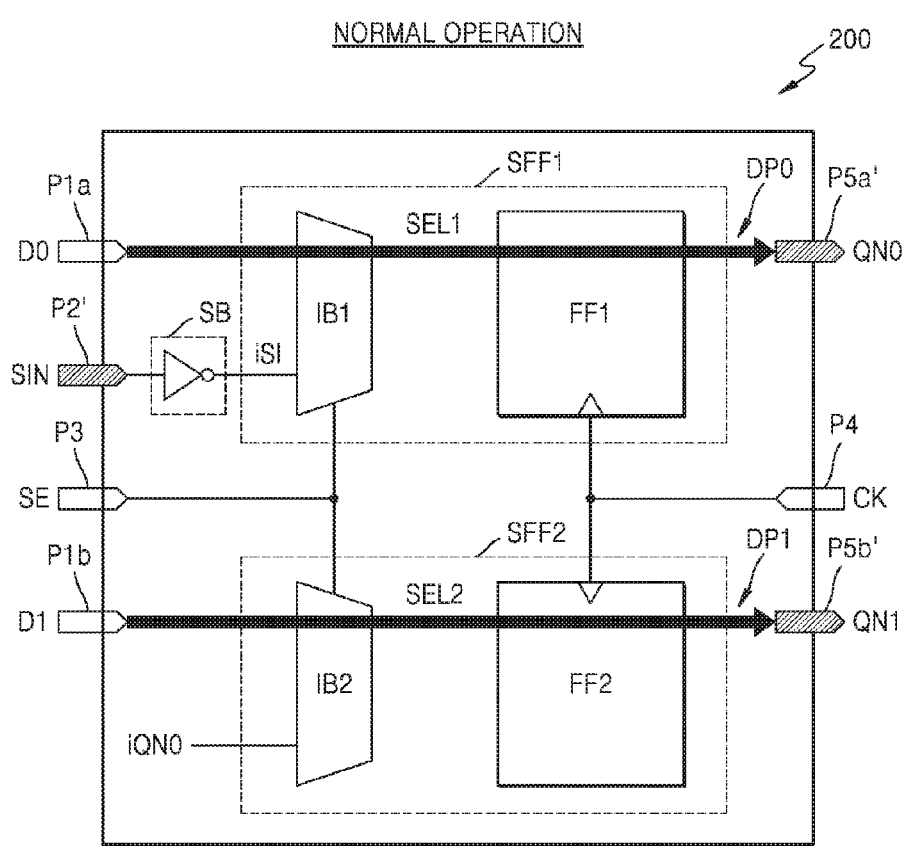
FIG. 9A shows data paths of the multi-bit flip-flop of FIG. 8.
Figure 9B:
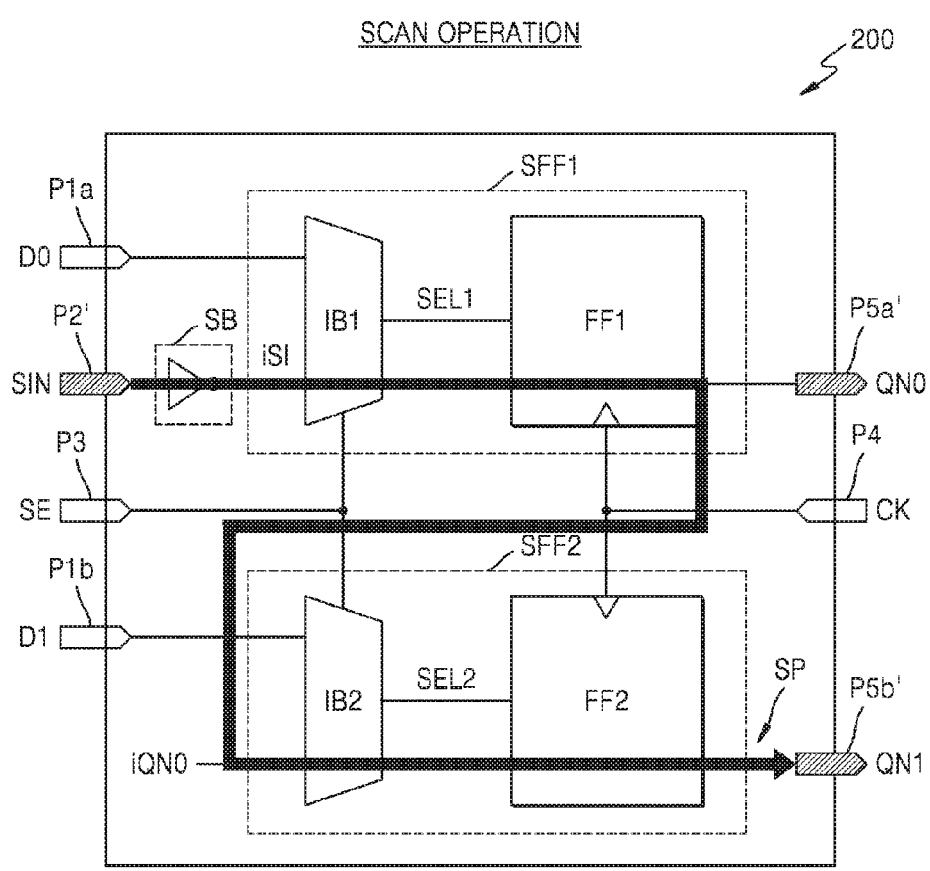
FIG. 9B shows a scan path of the multi-bit flip-flop of FIG. 8.

FIG. 9A shows first and second data paths DP0 and DP1 of multi-bit flip-flop 200 of FIG. 8, and FIG. 9B shows a scan path SP of multi-bit flip-flop 200 of FIG. 8.

Referring to FIG. 9A, when the scan enable signal SE indicates a normal operation mode, the first and second data paths DP0 and DP1 may be generated by multi-bit flip-flop 200. According to the present embodiment, when the scan enable signal SE has a first logic level, that is, when multi-bit flip-flop 200 is in a normal operation mode, the polarities of the first and second negative output signals QN0 and QN1 are respectively different (i.e., inverted) from those of the first and second data input signals D0 and D1.

Referring to FIG. 9B, when the scan enable signal SE indicates a scan test mode, a single scan path SP may be generated by multi-bit flip-flop 200. In this case, the first flip-flop FF1 may generate an internal negative signal, i.e., the internal signal iQN0, by mirroring the first negative output signal QN0, and may provide the generated internal negative signal iQN0 to the second input block IB2. According to the present embodiment, when the scan enable signal SE has a second logic level, that is, when multi-bit flip-flop 200 is in a scan test mode, the polarities of the first and second negative output signals QN0 and QN1 are the same as that of the negative scan input signal SIN.

According to the present embodiment, as a scan path of the first scan flip-flop SFF1 and a scan path of the second scan flip-flop SFF2 are connected to each other in this manner, the single scan path SP may be generated. In detail, an internal negative signal iQN0 having the same logic level as the first negative output signal QN0 of the first scan flip-flop SFF1 may be used as a scan input signal of the second scan flip-flop SFF2.

Figure 10:
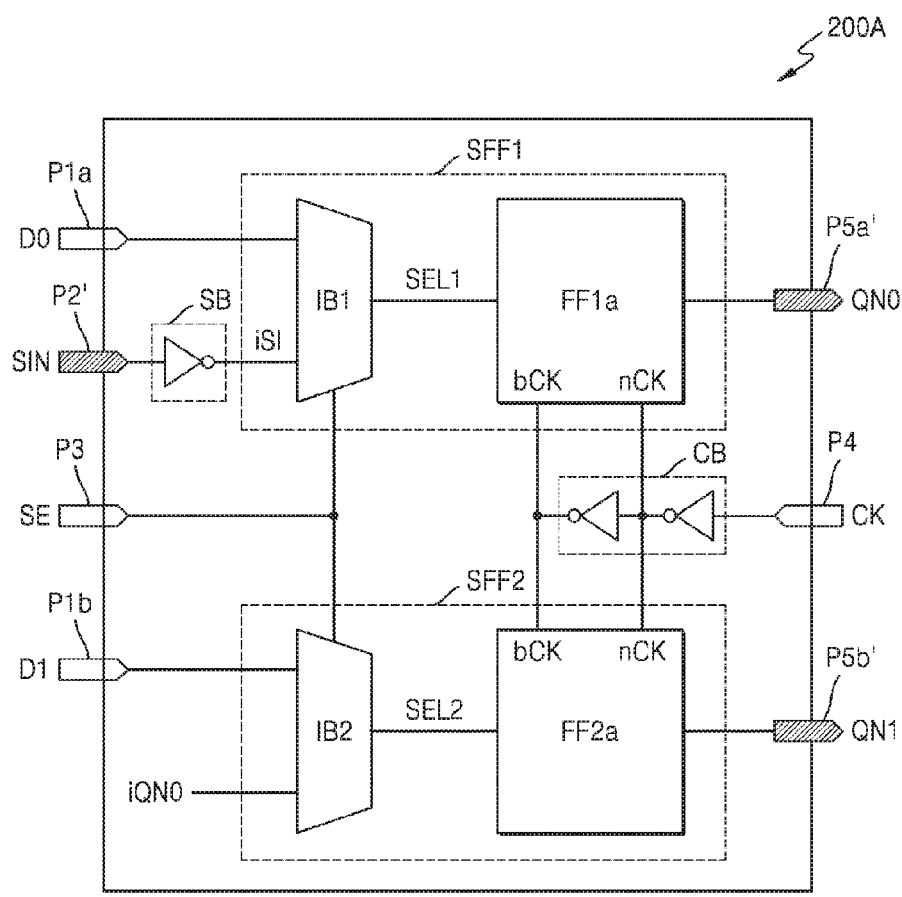
FIG. 10 is a block diagram of an embodiment of a multi-bit flip-flop.

FIG. 10 is a block diagram of a multi-bit flip-flop 200A according to an embodiment.

Referring to FIG. 10, multi-bit flip-flop 200A may include first and second scan flip-flops SFF1 and SFF2, a scan input buffer SB, and a clock buffer CB. Multi-bit flip-flop 200A according to the present embodiment corresponds to an implementation example of multi-bit flip-flop 200 of FIG. 8, and descriptions provided with reference to FIGS. 8, 9A and 9B may be applied to the present embodiment. In detail, multi-bit flip-flop 200A may further include the clock buffer CB, compared to multi-bit flip-flop 200 of FIG. 8.

The clock buffer CB may receive a clock signal CK, and may buffer the received clock signal CK and drive first and second flip-flops FF1a and FF2a. In the present embodiment, the clock buffer CB may receive the clock signal CK and provide an inverted clock signal nCK and a buffered clock signal bCK. Accordingly, the first and second flip-flops FF1a and FF2a may respectively latch first and second selection signals SEL1 and SEL2 in response to the inverted clock signal nCK and the buffered clock signal bCK. An embodiment in which multi-bit flip-flop 200A is implemented will be described in detail with reference to FIG. 11 below.

Figure 11:
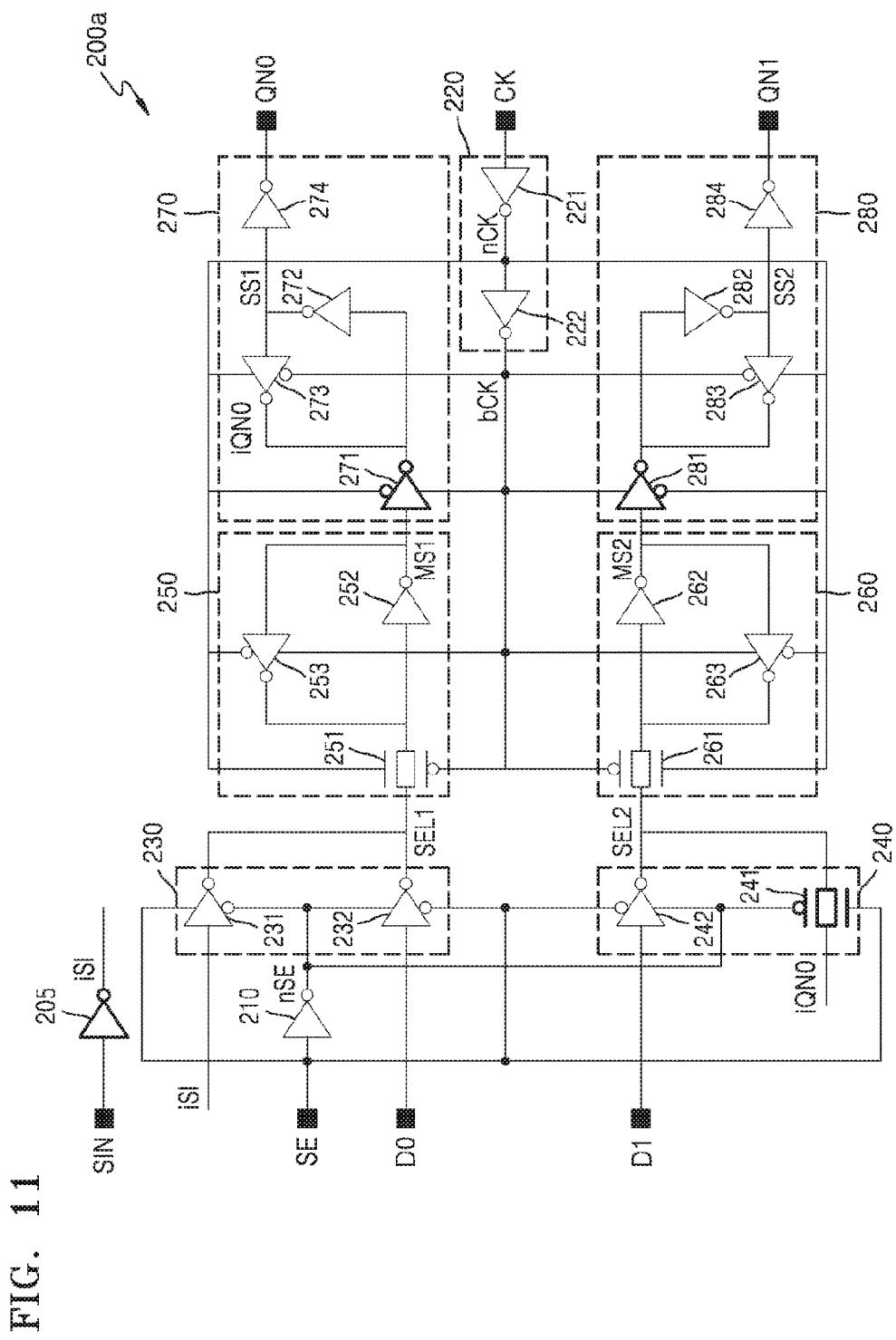
FIG. 11 is a circuit diagram of an embodiment of a multi-bit flip-flop corresponding to an example of the multi-bit flip-flop of FIG. 10.

FIG. 11 is a circuit diagram of a multi-bit flip-flop 200a corresponding to an example of multi-bit flip-flop 200A of FIG. 10.

Referring to FIG. 11, multi-bit flip-flop 200a may include a scan input buffer 205, a scan enable buffer 210, a clock buffer 220, first and second input blocks 230 and 240, first and second master latches 250 and 260, and first and second slave latches 270 and 280.

Scan input buffer 205 may receive a negative scan input signal SIN, and may buffer the received negative scan input signal SIN and provide an internal scan input signal iSI. Scan enable buffer 210 may receive a scan enable signal SE, and may buffer the received scan enable signal SE and provide an inverted scan enable signal nSE. Clock buffer 220 may receive a clock signal CK, and may buffer the received clock signal CK and provide an inverted clock signal nCK and a buffered clock signal bCK.

First input block 230 may include first and second input tri-state inverters 231 and 232. First input tri-state inverter 231 may receive the internal scan input signal iSI, and may output a signal obtained by inverting the internal scan input signal iSI, in response to the scan enable signal SE and the inverted scan enable signal nSE. Second input tri-state inverter 232 may receive a first data input signal D0, and may output a signal obtained by inverting the first data input signal D0, in response to the scan enable signal SE and the inverted scan enable signal nSE. The first selection signal SEL1 may be one selected from an output of first input tri-state inverter 231 and an output of second input tri-state inverter 232, depending on the scan enable signal SE.

First master latch 250 may include a first transmission gate 251, a first inverter 252, and a first tri-state inverter 253. First slave latch 270 may include a first transmission tri-state inverter 271, a second inverter 272, a second tri-state inverter 273, and a third inverter 274. First transmission tri-state inverter 271 may output a signal obtained by inverting an output of first master latch 250, that is, a first master signal MS1, in response to the inverted clock signal nCK and the buffered clock signal bCK. Second inverter 272 may include a first input terminal connected to an output terminal of first transmission tri-state inverter 271, and may include a first output terminal, and may invert an output of first transmission tri-state inverter 271 to provide a first slave signal SS1. Second tri-state inverter 273 may include a second input terminal connected to the first output terminal of inverter 272, and may include a second output terminal connected to the first input terminal of inverter 272. Second tri-state inverter 273 may receive the first slave signal SS1, and may output a signal obtained by inverting the first slave signal SS1, in response to the inverted clock signal nCK and the buffered clock signal bCK. Third inverter 274 may invert the first slave signal SS1 to provide a first negative output signal QN0.

In the present embodiment, an output of second tri-state inverter 273 may have the same logic level as an output of third inverter 274, that is, the first negative output signal QN0. Accordingly, an output signal iQN0 of second tri-state inverter 273 may be a signal obtained by mirroring the first negative output signal QN0. Hereinafter, the output signal iQN0 of second tri-state inverter 273 is referred to as an internal negative signal iQN0 corresponding to the first negative output signal QN0. However, the inventive concept is not limited thereto, and a signal obtained through an even number of inverters from the first negative output signal QN0 may be used as the internal negative signal iQN0.

In the present embodiment, the internal negative signal iQN0 output by second tri-state inverter 273 may be used as a scan input signal that is applied to second input block 240. Accordingly, a scan path passing through first input block 230, first master latch 250, and first slave latch 270 may be connected to a scan path passing through second input block 240, second master latch 260, and second slave latch 280. In some embodiments, an output of second inverter 272, that is, the first slave signal SS1, may be used as an internal signal.

First slave latch 270 may include first transmission tri-state inverter 271 to receive the first master signal MS1 and provide an inverted first master signal by inverting the first master signal MS1. Accordingly, when the scan enable signal SE indicates a normal operation mode, multi-bit flip-flop 200a may invert the first data input signal D0 and provide the first negative output signal QN0, and thus, the polarity of the first negative output signal QN0 may be different from that of the first data input signal D0. When the scan enable signal SE indicates a scan test mode, the polarity of the first negative output signal QN0 may be the same as that of the negative scan input signal SIN.

Second input block 240 may include an input transmission gate 241 and a third input tri-state inverter 242. Input transmission gate 241 may receive the internal negative signal iQN0 corresponding to the first negative output signal QN0, and may transmit the received internal negative signal iQN0 to second master latch 260 in response to the scan enable signal and the inverted scan enable signal nSE. The third input of tri-state inverter 242 may receive a second data input signal D1, and may output a signal obtained by inverting the second data input signal D1, in response to the scan enable signal SE and the inverted scan enable signal nSE. A second selection signal SEL2 may be one selected from an output of input transmission gate 241 and an output of third input tri-state inverter 242, depending on the scan enable signal SE.

Second input block 240 may include input transmission gate 241 to transmit the internal negative signal iQN0 to second master latch 260, and may transmit the internal negative signal iQN0 to second master latch 260 without performing an inverting operation on the internal negative signal iQN0. Accordingly, when the scan enable signal SE indicates a scan test mode, multi-bit flip-flop 200a does not perform an inverting operation on the internal negative signal iQN0, and thus, the polarity of a second negative output signal QN1 may be the same as that of the internal negative signal iQN0.

Second master latch 260 may include a second transmission gate 261, a fourth inverter 262, and a third tri-state inverter 263. Second slave latch 280 may include a second transmission tri-state inverter 281, a fifth inverter 282, a fourth tri-state inverter 283, and a sixth inverter 284. Second slave latch 280 may include second transmission tri-state inverter 281 to receive a second master signal MS2 and provide an inverted second master signal by inverting second master signal MS2. Accordingly, when the scan enable signal SE indicates a normal operation mode, multi-bit flip-flop 200a may invert the second data input signal D1 and provide the second negative output signal QN1, and thus, the polarity of the second negative output signal QN1 may be different from that of the second data input signal D1. When the scan enable signal SE indicates a scan test mode, the polarity of the second negative output signal QN1 may be the same as that of the internal negative signal iQN0, and thus also the same as the negative scan input signal SIN.

Figure 12:
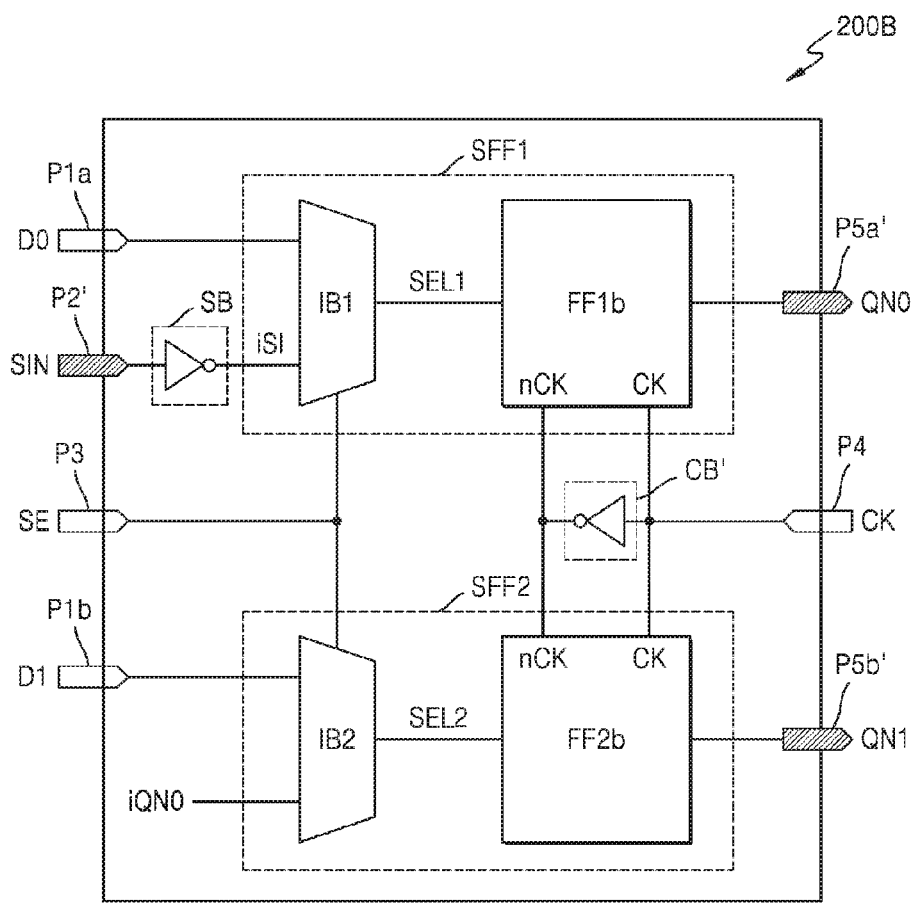
FIG. 12 is a block diagram of an embodiment of a multi-bit flip-flop.

FIG. 12 is a block diagram of an embodiment of a multi-bit flip-flop 200B.

Referring to FIG. 12, multi-bit flip-flop 200B may include first and second scan flip-flops SFF1 and SFF2, a scan input buffer SB, and a clock buffer CB'. Multi-bit flip-flop 200B according to the present embodiment corresponds to an implementation example of multi-bit flip-flop 200 of FIG. 8, and descriptions provided with reference to FIGS. 8, 9A and 9B may be applied to the present embodiment. In detail, multi-bit flip-flop 200B may further include the clock buffer CB' compared to multi-bit flip-flop 200 of FIG. 8.

The clock buffer CB' may receive a clock signal CK, and may buffer the received clock signal CK and drive first and second flip-flops FF1b and FF2b. In the present embodiment, the clock buffer CB' may receive the clock signal CK and provide an inverted clock signal nCK. Accordingly, the first and second flip-flops FF1b and FF2b may respectively latch first and second selection signals SEL1 and SEL2 in response to the clock signal CK and the inverted clock signal nCK. According to the present embodiment, the size of the clock buffer CB' may be relatively reduced, and thus, the size and power consumption of a cell including multi-bit flip-flop 200B implemented therein may be reduced. An embodiment in which multi-bit flip-flop 200B is implemented will be described in detail with reference to FIG. 13 below.

Figure 13:
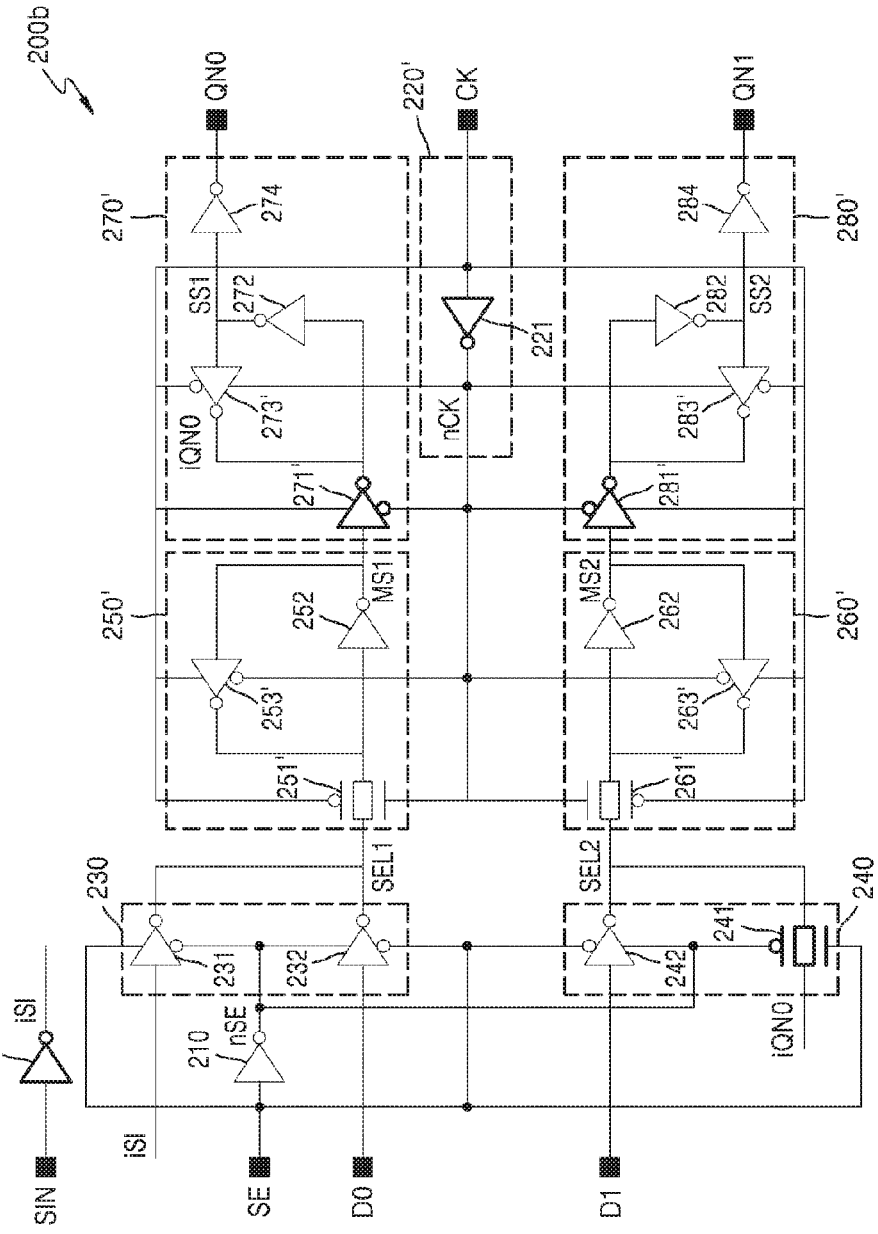
FIG. 13 is a circuit diagram of an embodiment of a multi-bit flip-flop corresponding to an example of the multi-bit flip-flop of FIG. 12.

FIG. 13 is a circuit diagram of a multi-bit flip-flop 200b corresponding to an example of multi-bit flip-flop 200B of FIG. 12.

Referring to FIG. 13, multi-bit flip-flop 200b may include a scan input buffer 205, a scan enable buffer 210, a clock buffer 220', first and second input blocks 230 and 240, first and second master latches 250' and 260', and first and second slave latches 270' and 280'. Clock buffer 220' included in multi-bit flip-flop 200b may include a first clock inverter 221, and thus, first and second master latches 250' and 260' and the first and second slave latches 270' and 280' may be driven by a clock signal CK and an inverted clock signal nCK.

First master latch 250' may include a first transmission gate 251', a first inverter 252, and a first tri-state inverter 253'. First transmission gate 251' may transmit the first selection signal SEL1 to First inverter 252 in response to the clock signal CK and the inverted clock signal nCK. First inverter 252 may invert the first selection signal SEL1 and provide a first master signal MS1. First tri-state inverter 253' may receive the first master signal MS1, and may output a signal obtained by inverting the first master signal MS1, in response to the clock signal CK and the inverted clock signal nCK.

First slave latch 270' may include a first transmission tri-state inverter 271', a second inverter 272, a second tri-state inverter 273', and a third inverter 274. First transmission tri-state inverter 271' may output a signal obtained by inverting an output of first master latch 250', that is, the first master signal MS1, in response to the clock signal CK and the inverted clock signal nCK. Second inverter 272 may include a first input terminal connected to an output terminal of first transmission tri-state inverter 271', and may include and a first output terminal, and may invert an output of first transmission tri-state inverter 271' to provide a first slave signal SS1. Second tri-state inverter 273' may include a second input terminal connected to the first output terminal of second inverter 172 and may include a second output terminal connected to the first input terminal of second inverter 172. Second tri-state inverter 273' may receive the first slave signal SS1, and may output a signal obtained by inverting the first slave signal SS1, in response to the clock signal CK and the inverted clock signal nCK. Third inverter 274 may invert the first slave signal SS1 to provide a first negative output signal QN0.

Figure 14:
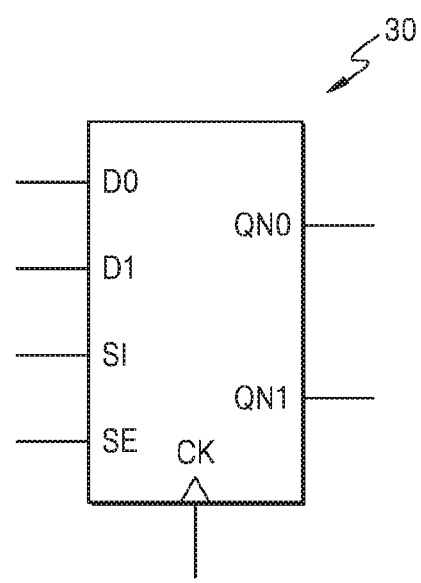
FIG. 14 is a logic symbol of an embodiment of a multi-bit flip-flop.

FIG. 14 is a logic symbol of an embodiment of a multi-bit flip-flop 30.

Referring to FIG. 14, multi-bit flip-flop 30 may receive first and second data input signals D0 and D1 and a scan input signal SI and select the first and second data input signals D0 and D1 or the scan input signal SI in response to a scan enable signal SE. Multi-bit flip-flop 30 may latch a selected signal in response to a clock signal CK and provide first and second negative output signals QN0 and QN1.

In the present embodiment, multi-bit flip-flop 30 may receive two data input signals, i.e., the first and second data input signals D0 and D1, and provide two negative output signals, i.e., the first and second negative output signals QN0 and QN1. However, the inventive concept is not limited thereto, and in some embodiments, multi-bit flip-flop 30 may receive N data input signals and provide N negative output signals (where N is an integer that is equal to or greater than 2). In some embodiments, multi-bit flip-flop 30 may receive a single scan input signal SI regardless of the number of data input signals. Accordingly, multi-bit flip-flop 30 may be referred to as a multi-bit single scan-in flip-flop.

The scan enable signal SE may indicate a first operation mode or a second operation mode, depending on a logic level thereof, as explained above with respect to multi-bit flip-flop 10 of FIG. 1.

When the scan enable signal SE indicates a normal operation mode, multi-bit flip-flop 30 may perform a normal operation for latching the first and second data input signals D0 and D1 and providing the first and second negative output signals QN0 and QN1. According to the present embodiment, the polarities of the first and second data input signals D0 and D1 may be respectively different from those of the first and second negative output signals QN0 and QN1.

When the scan enable signal SE indicates a scan test mode, multi-bit flip-flop 30 may perform a scan operation for latching the scan input signal SI. In the present embodiment, the scan input signal SI may be received through one input pin, and scan paths of two flip-flops in multi-bit flip-flop 30 may be connected to each other. In this case, an internal signal corresponding to the first negative output signal QN0 of one flip-flop of multi-bit flip-flop 30 may be used as a next scan input signal for another flip-flop of multi-bit flip-flop 30. In this manner, multi-bit flip-flop 30 may be a single scan-in flip-flop that receives a single scan input signal SI. According to the present embodiment, the polarity of the scan input signal SI may be respectively different from those of the first and second negative output signals QN0 and QN1.

Figure 15:
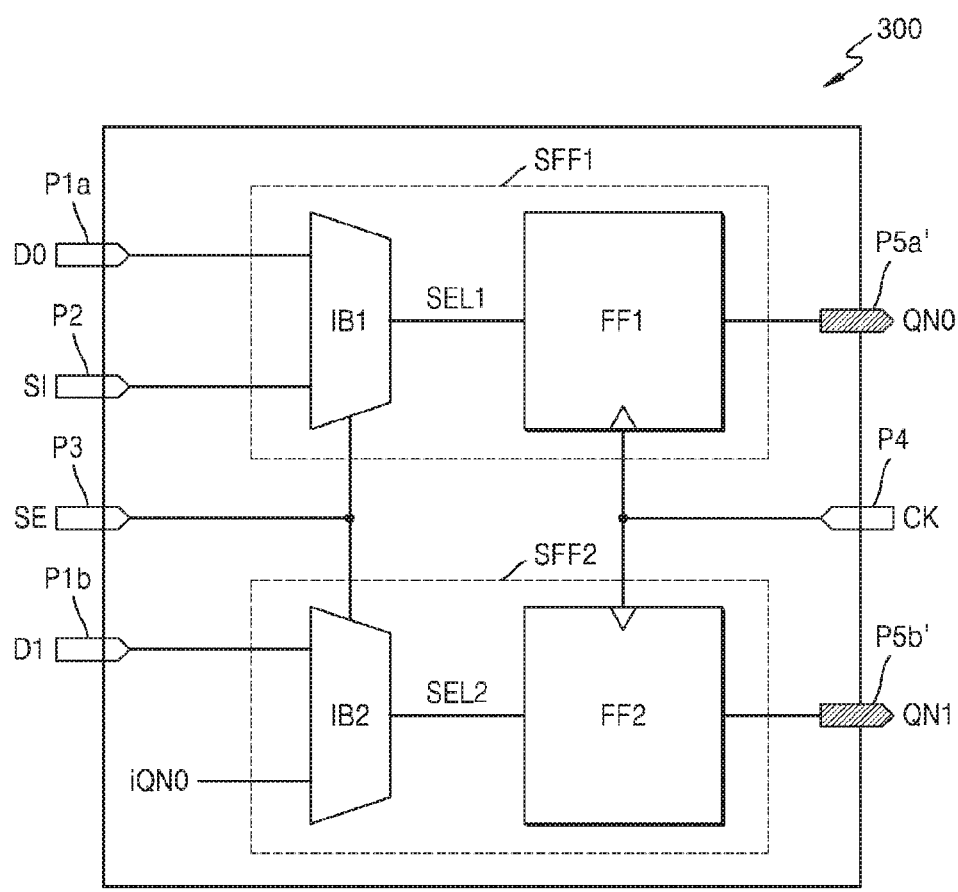
FIG. 15 is a block diagram of an embodiment of a multi-bit flip-flop.

FIG. 15 is a block diagram of an embodiment of a multi-bit flip-flop 300.

Referring to FIG. 15, multi-bit flip-flop 300 may include first and second scan flip-flops SFF1 and SFF2, and may be implemented with a single cell.

In the present embodiment, multi-bit flip-flop 300 may include first and second data input pins P1a and P1b, a scan input pin P2, a scan enable input pin P3, a clock input pin P4, and first and second negative output pins P5a' and P5b'. In detail, the first and second data input pins P1a and P1b may respectively receive first and second data input signals D0 and D1, the scan input pin P2 may receive a scan input signal SI, the scan enable input pin P3 may receive a scan enable signal SE, the clock input pin P4 may receive a clock signal CK, and the first and second negative output pins P5a' and P5b' may respectively output first and second negative output signals QN0 and QN1. According to the present embodiment, as multi-bit flip-flop 300 includes a single scan input pin P2, the degree of freedom of a circuit design freedom may be improved, compared to a case in which a multi-bit flip-flop includes a plurality of scan input pins. In addition, according to the present embodiment, as multi-bit flip-flop 300 includes the first and second negative output pins P5a' and P5b', the pin polarity of multi-bit flip-flop 300 may match the pin polarity of a high speed flip-flop that is connected to multi-bit flip-flop 300 in a subsequent stage.

The first scan flip-flop SFF1 may include the first input block IB1 and a first flip-flop FF1. The second scan flip-flop SFF2 may include a second input block IB2 and a second flip-flop FF2. The first input block IB1 may receive a first data input signal D0 and the scan input signal SI, and may select one of the first data input signal D0 and scan input signal SI as a first selection signal SEL1 in response to a scan enable signal SE. The first flip-flop FF1 may receive the first selection signal SEL1, and may latch the first selection signal SEL1 in response to a clock signal CK and provide a first negative output signal QN0 in correspondence to the first selection signal SEL1. The second input block IB2 may receive a second data input signal D1 and an internal signal iQN0, and may select one of the second data input signal D1 and the internal signal iQN0 as a second selection signal SEL2 in response to a scan enable signal SE. The second flip-flop FF2 may receive the second selection signal SEL2, and may latch the second selection signal SEL2 in response to a clock signal CK and provide a second negative output signal QN1 in correspondence to the second selection signal SEL2.

In an embodiment, the internal signal iQN0 may be a signal obtained in correspondence to the first negative output signal QN0. In an embodiment, the internal signal iQN0 may have the same logic level as the first negative output signal QN0. However, the inventive concept is not limited thereto, and in some embodiments, the internal signal iQN0 may have a logic level corresponding to the inversion of the logic level of the first negative output signal QN0. In an embodiment, the internal signal iQN0 may be generated by the first scan flip-flop SFF1. More details will be described with reference to FIGS. 16A and 16B.

Figure 16A:
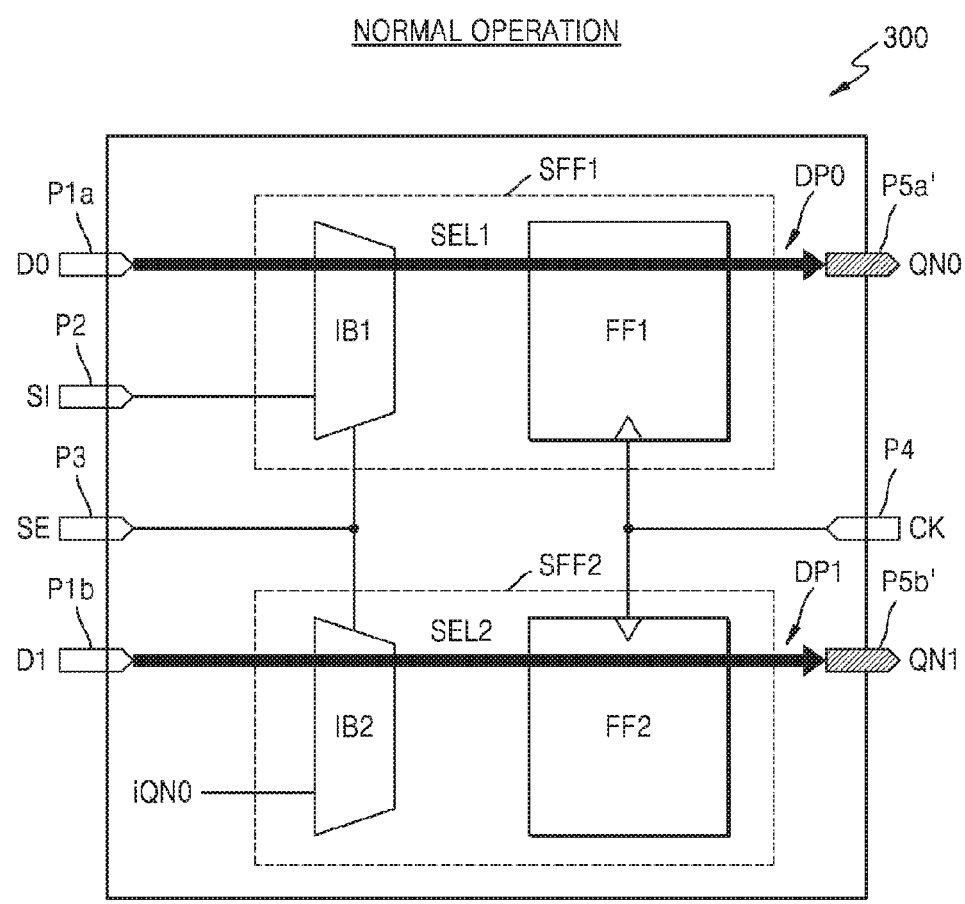
FIG. 16A shows data paths of the multi-bit flip-flop of FIG. 15.
Figure 16B:
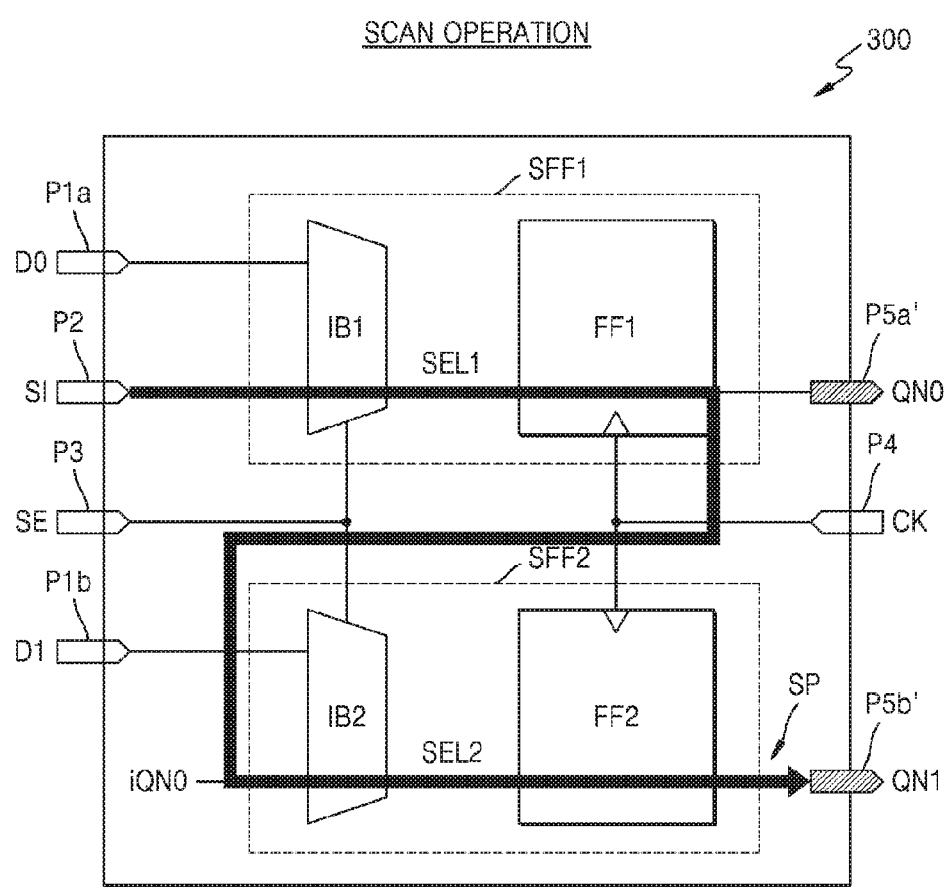
FIG. 16B shows a scan path of the multi-bit flip-flop of FIG. 15.

FIG. 16A shows first and second data paths DP0 and DP1 of multi-bit flip-flop 300 of FIG. 15, and FIG. 16B shows a scan path SP of multi-bit flip-flop 300 of FIG. 15.

Referring to FIG. 16A, when the scan enable signal SE indicates a normal operation mode, the first and second data paths DP0 and DP1 may be generated by multi-bit flip-flop 300. According to the present embodiment, when the scan enable signal SE has a first logic level, that is, when multi-bit flip-flop 300 is in a normal operation mode, the polarities of the first and second negative output signals QN0 and QN1 are respectively different (i.e., inverted) from those of the first and second data input signals D0 and D1.

Referring to FIG. 16B, when the scan enable signal SE indicates a scan test mode, a single scan path SP may be generated by multi-bit flip-flop 300. Specifically, when the scan enable signal SE has a second logic level, the first input block IB1 may select the scan input signal SI as the first selection signal SEL1, and the first flip-flop FF1 may latch the first selection signal SEL1 and provide the first negative output signal QN0 in correspondence to the first selection signal SEL1. In this case, the first flip-flop FF1 may generate an internal signal iQN0 by mirroring the first negative output signal QN0, and may provide the generated internal signal iQN0 to the second input block IB2. In addition, when the scan enable signal SE has a second logic level, the second input block IB2 may select the internal signal iQN0 as the second selection signal SEL2, and the second flip-flop FF2 may latch the second selection signal SEL2 and provide the second negative output signal QN1. According to the present embodiment, when the scan enable signal SE has a second logic level, that is, when multi-bit flip-flop 300 is in a scan test mode, the polarities of the first and second negative output signals QN0 and QN1 are different from that of the scan input signal SI.

According to the present embodiment, as a scan path of the first scan flip-flop SFF1 and a scan path of the second scan flip-flop SFF2 are connected to each other in this manner, the single scan path SP may be generated. In detail, an internal negative signal iQN0 having the same logic level as the first negative output signal QN0 of the first scan flip-flop SFF1 may be used as a scan input signal of the second scan flip-flop SFF2.

Figure 17:
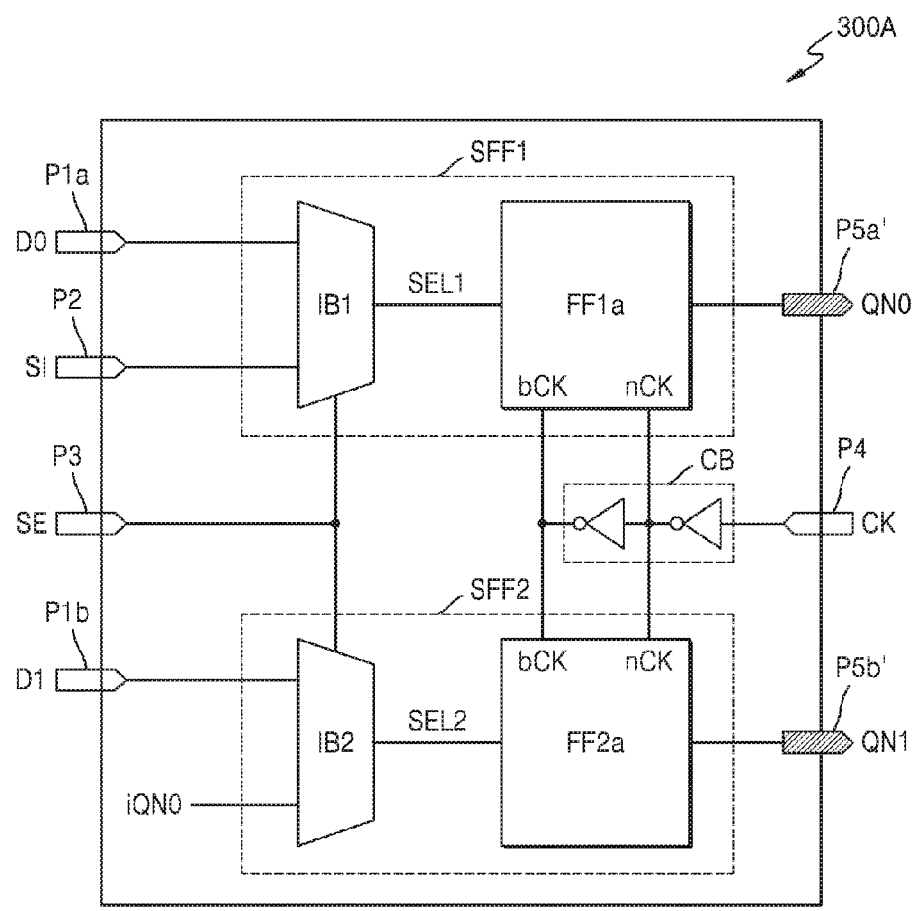
FIG. 17 is a block diagram of an embodiment of a multi-bit flip-flop.

FIG. 17 is a block diagram of an embodiment of a multi-bit flip-flop.

Referring to FIG. 17, multi-bit flip-flop 300A may include first and second scan flip-flops SFF1 and SFF2 and a clock buffer CB. Multi-bit flip-flop 300A according to the present embodiment corresponds to an implementation example of multi-bit flip-flop 300 of FIG. 15, and descriptions provided with reference to FIGS. 15, 16A and 16B may be applied to the present embodiment. In detail, multi-bit flip-flop 300A may further include the clock buffer CB, compared to multi-bit flip-flop 300 of FIG. 15.

The clock buffer CB may receive a clock signal CK, and may buffer the received clock signal CK and drive first and second flip-flops FF1a and FF2a. In the present embodiment, the clock buffer CB may receive the clock signal CK and provide an inverted clock signal nCK and a buffered clock signal bCK. Accordingly, the first and second flip-flops FF1a and FF2a may respectively latch first and second selection signals SEL1 and SEL2 in response to the inverted clock signal nCK and the buffered clock signal bCK.

Figure 18:
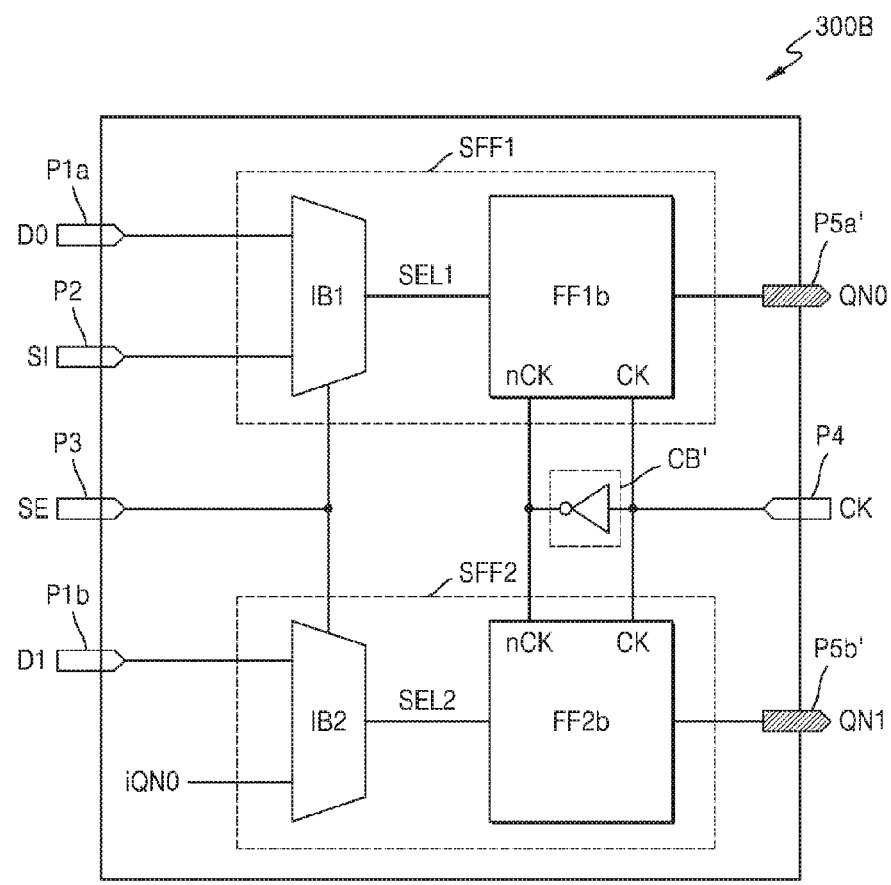
FIG. 18 is a block diagram of an embodiment of a multi-bit flip-flop.

FIG. 18 is a block diagram of an embodiment of a multi-bit flip-flop 300B.

Referring to FIG. 18, multi-bit flip-flop 300B may include first and second scan flip-flops SFF1 and SFF2 and a clock buffer CB'. Multi-bit flip-flop 300B according to the present embodiment corresponds to an implementation example of multi-bit flip-flop 300 of FIG. 15, and descriptions provided with reference to FIGS. 15, 16A and 16B may be applied to the present embodiment. In detail, multi-bit flip-flop 300B may further include the clock buffer CB' compared to multi-bit flip-flop 300 of FIG. 15.

The clock buffer CB' may receive a clock signal CK, and may buffer the received clock signal CK and drive first and second flip-flops FF1b and FF2b. In the present embodiment, the clock buffer CB' may receive the clock signal CK and provide an inverted clock signal nCK. Accordingly, the first and second flip-flops FF1b and FF2b may respectively latch first and second selection signals SEL1 and SEL2 in response to the clock signal CK and the inverted clock signal nCK. Various embodiments in which multi-bit flip-flop 300B is implemented will be described in detail with reference to FIGS. 19 to 22 below.

Figure 19:
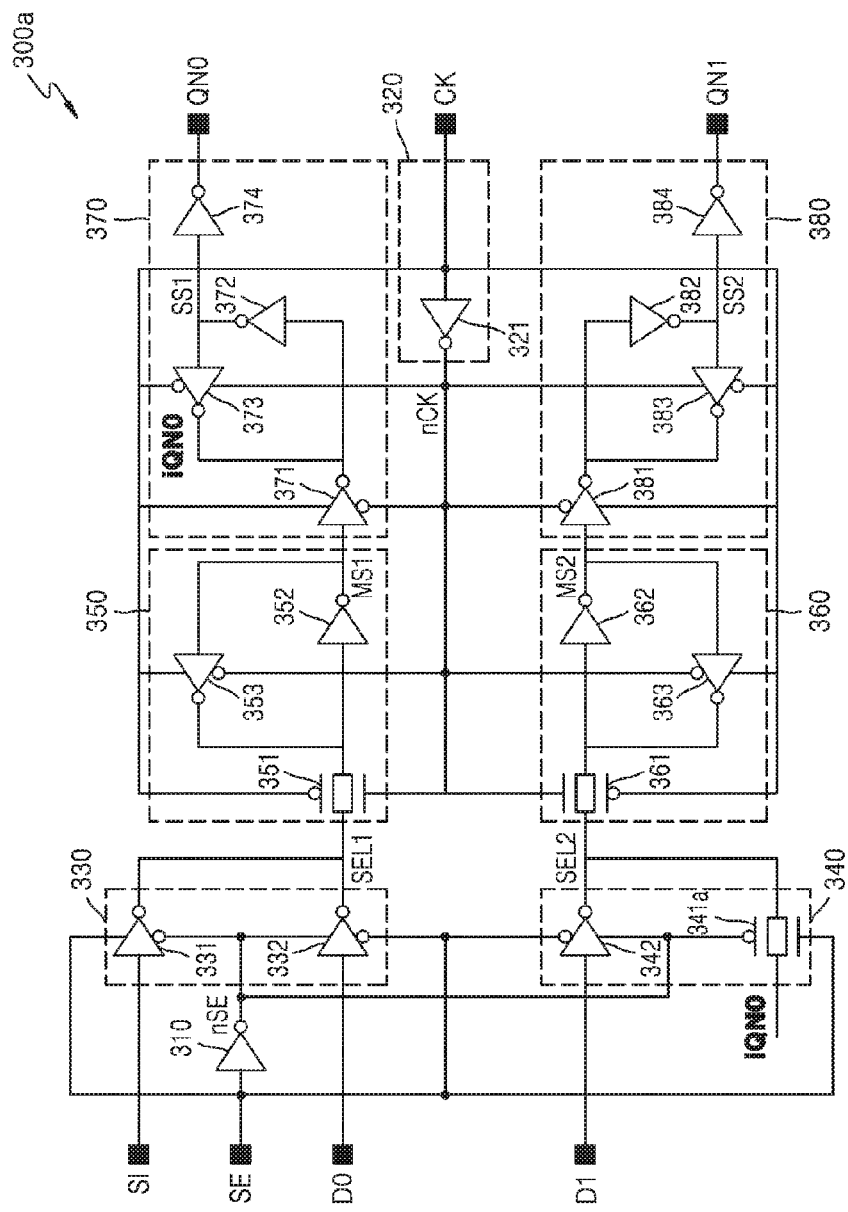
FIGS. 19, 20, 21 and 22 are circuit diagrams of multi-bit flip-flops corresponding to examples of the multi-bit flip-flop of FIG. 18.

FIG. 19 is a circuit diagram of a multi-bit flip-flop 300a corresponding to an example of multi-bit flip-flop 300B of FIG. 18.

Referring to FIG. 19, multi-bit flip-flop 300a may include a scan enable buffer 310, a clock buffer 320, first and second input blocks 330 and 340, first and second master latches 350 and 360, and first and second slave latches 370 and 380.

Scan enable buffer 310 may receive a scan enable signal SE, and may buffer the received scan enable signal SE and provide an inverted scan enable signal nSE. Clock buffer 320 may receive a clock signal CK, and may buffer the received clock signal CK and provide an inverted clock signal nCK. In detail, clock buffer 320 may include a first clock inverter 321. First clock inverter 321 may receive the clock signal CK and provide the inverted clock signal nCK.

First input block 330 may include first and second input tri-state inverters 331 and 332. First master latch 350 may include a first transmission gate 351, a first inverter 352, and a first tri-state inverter 353. First slave latch 370 may include a first transmission tri-state inverter 371, a second inverter 372, a second tri-state inverter 373, and a third inverter 374. First transmission tri-state inverter 371 may output a signal obtained by inverting an output of first master latch 350, that is, a first master signal MS1, based on the clock signal CK, and more specifically, in response to the clock signal CK and the inverted clock signal nCK. Second inverter 372 may include a first input terminal connected to an output terminal of first transmission tri-state inverter 371, and may include a first output terminal, and may invert an output of first transmission tri-state inverter 371 to provide a first slave signal SS1. Second tri-state inverter 373 may include a second input terminal connected to the first output terminal of second inverter 372, and may include a second output terminal connected to the first input terminal of second inverter 372. Second tri-state inverter 373 may receive the first slave signal SS1, and may output a signal obtained by inverting the first slave signal SS1, based on the clock signal CK, and more specifically, in response to the clock signal CK and the inverted clock signal nCK. Third inverter 374 may invert the first slave signal SS1 to provide a first negative output signal QN0.

In the present embodiment, an output of second tri-state inverter 373 may have the same logic level as an output of third inverter 374, that is, the first negative output signal QN0. Accordingly, an output signal iQN0 of second tri-state inverter 373 may be a signal obtained by mirroring the first negative output signal QN0. Hereinafter, the output signal iQN0 of second tri-state inverter 373 is referred to as an internal negative signal iQN0 corresponding to the first negative output signal QN0. However, the inventive concept is not limited thereto, and a signal obtained through an even number of inverters from the first negative output signal QN0 may be used as the internal negative signal iQN0.

In the present embodiment, the polarity of the scan input signal SI and the polarity of the internal negative signal iQN0 may be different from each other. In the present embodiment, the internal negative signal iQN0 output by second tri-state inverter 373 may be used as a scan input signal that is applied to second input block 340. Accordingly, a scan path passing through first input block 330, first master latch 350, and first slave latch 370 may be connected to a scan path passing through second input block 340, second master latch 360, and second slave latch 380.

First slave latch 370 may include first transmission tri-state inverter 371 to receive the first master signal MS1 and provide an inverted first master signal by inverting the first master signal MS1. Accordingly, when the scan enable signal SE indicates a normal operation mode, multi-bit flip-flop 300a may invert the first data input signal D0 to provide the first negative output signal QN0, and thus, the polarity of the first negative output signal QN0 may be different from that of the first data input signal D0.

Second input block 340 may include a first input transmission gate 341a and a third input tri-state inverter 342. Second input block 340 may include first input transmission gate 341a to transmit the internal negative signal iQN0 to second master latch 360, and may transmit the internal negative signal iQN0 to second master latch 360 without performing an inverting operation on the internal negative signal iQN0. Accordingly, when the scan enable signal SE indicates a scan test mode, multi-bit flip-flop 300a does not invert the internal negative signal iQN0, and thus, the polarity of a second negative output signal QN1 may be the same as that of the internal negative signal iQN0. In the present embodiment, since the polarity of the scan input signal SI and the polarity of the internal negative signal iQN0 are different from each other, the polarity of the scan input signal SI and the polarity of the second negative output signal QN1 may be different from each other.

Second master latch 360 may include a second transmission gate 361, a fourth inverter 362, and a third tri-state inverter 363. Second slave latch 380 may include a second transmission tri-state inverter 381, a fifth inverter 382, a fourth tri-state inverter 383, and a sixth inverter 384. Second slave latch 380 may include second transmission tri-state inverter 381 to receive a second master signal MS2 and provide an inverted second master signal by inverting the second master signal MS2. Accordingly, when the scan enable signal SE indicates a normal operation mode, multi-bit flip-flop 300a may invert the second data input signal D1 to provide the second negative output signal QN1, and thus, the polarity of the second negative output signal QN1 may be different from that of the second data input signal D1. When the scan enable signal SE indicates a scan test mode, multi-bit flip-flop 300a may invert the internal negative signal iQN0 and provide the second negative output signal QN1, and thus, the polarity of the scan input signal SI and the polarity of the second negative output signal QN1 may be different from each other.

Figure 20:
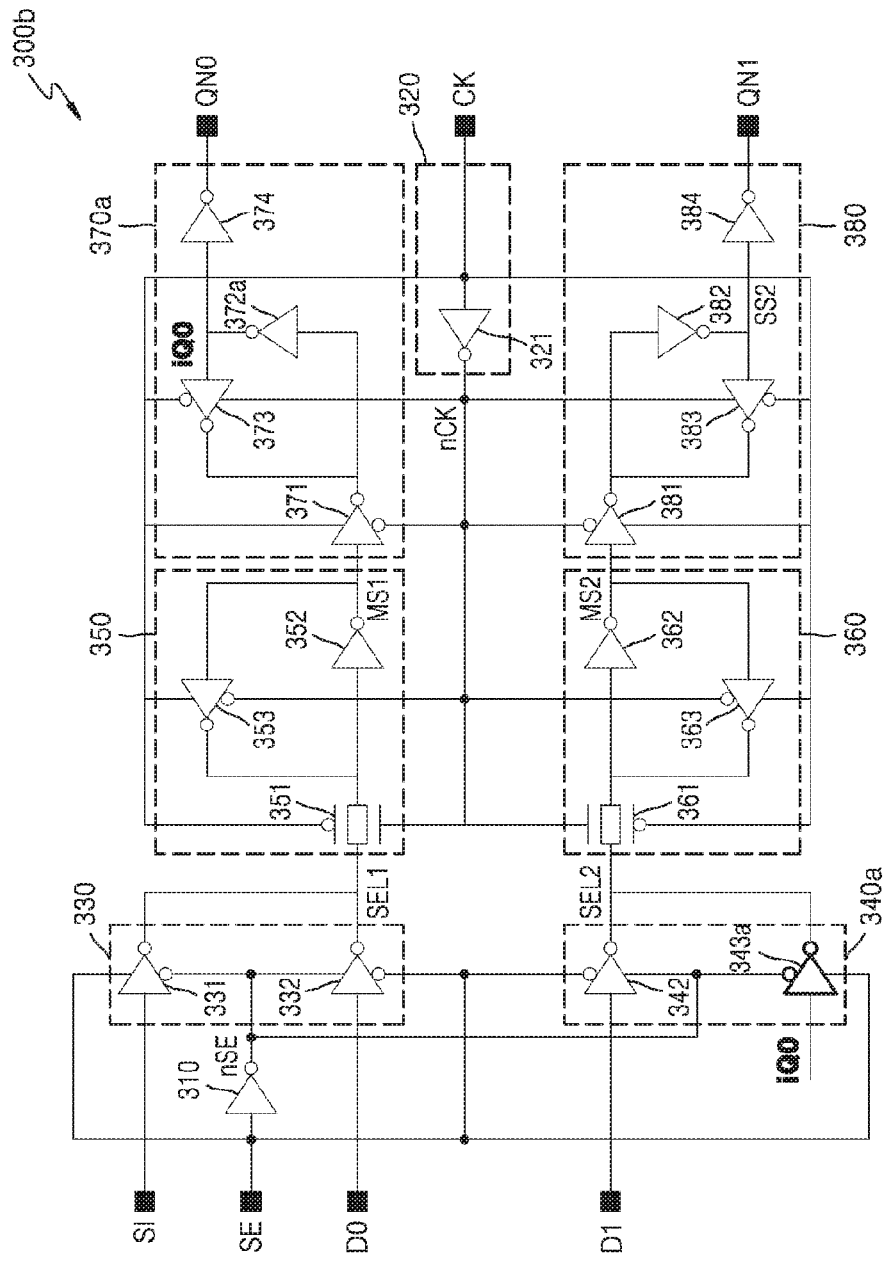

FIG. 20 is a circuit diagram of a multi-bit flip-flop 300b corresponding to an example of multi-bit flip-flop 300B of FIG. 18.

Referring to FIG. 20, multi-bit flip-flop 300b may include scan enable buffer 310, clock buffer 320, first and second input blocks 330 and 340a, first and second master latches 350 and 360, and first and second slave latches 370a and 380. Multi-bit flip-flop 300b corresponds to a modified embodiment of multi-bit flip-flop 300a of FIG. 19. Compared to multi-bit flip-flop 300a of FIG. 19, a method of generating an internal signal iQ0 in first slave latch 370a of multi-bit flip-flop 300b may be different from that in first slave latch 370 of multi-bit flip-flop 300a, and the configuration of second input block 340a of multi-bit flip-flop 300b may be different from that of second input block 340 of multi-bit flip-flop 300a.

In the present embodiment, first slave latch 370a may include first transmission tri-state inverter 371, a second inverter 372a, second tri-state inverter 373, and third inverter 374. First transmission tri-state inverter 371 may invert an output of first master latch 350, that is, a first master signal MS1, in response to a clock signal CK and an inverted clock signal nCK. Second inverter 372a may invert an output of first transmission tri-state inverter 371. Second tri-state inverter 373 may receive an output of second inverter 372a, and may invert the output of second inverter 372a in response to the clock signal CK and the inverted clock signal nCK. Third inverter 374 may invert the output of second inverter 372a and provide a first negative output signal QN0.

In the present embodiment, the output of second inverter 372a may be connected to an input of third inverter 374, and the negative output signal QN0 may be an output of third inverter 374. Accordingly, the output of second inverter 372a may have a logic level that is opposite to the logic level of an output of third inverter 374, that is, the first negative output signal QN0. Hereinafter, an output signal iQ0 of second inverter 372a is referred to as an internal signal iQ0 corresponding to the first negative output signal QN0. However, the inventive concept is not limited thereto, and a signal obtained through an odd number of inverters from the first negative output signal QN0 may be used as the internal signal iQ0.

In the present embodiment, the polarity of a scan input signal SI and the polarity of the internal signal iQ0 may be different from each other. In the present embodiment, the internal signal iQ0 that is the output signal of second inverter 372a may be used as a scan input signal that is applied to second input block 340a. Accordingly, a scan path passing through first input block 330, first master latch 350, and first slave latch 370a may be connected to a scan path passing through second input block 340a, second master latch 360, and second slave latch 380.

In the present embodiment, second input block 340a may include third input tri-state inverter 342 and a fourth input tri-state inverter 343a. Second input block 340a may include fourth input tri-state inverter 343a to transmit the internal signal iQ0 to second master latch 360, and may invert the internal signal iQ0 and transmit an inverted internal signal to second master latch 360. Accordingly, when a scan enable signal SE indicates a scan test mode, multi-bit flip-flop 300b inverts the internal signal iQ0, and thus, the polarity of a second negative output signal QN1 may be different from that of the internal signal iQ0. In the present embodiment, since the polarity of the scan input signal SI is the same as that of the internal signal iQ0, the polarity of the scan input signal SI and the polarity of the second negative output signal QN1 may be different from each other.

Figure 21:
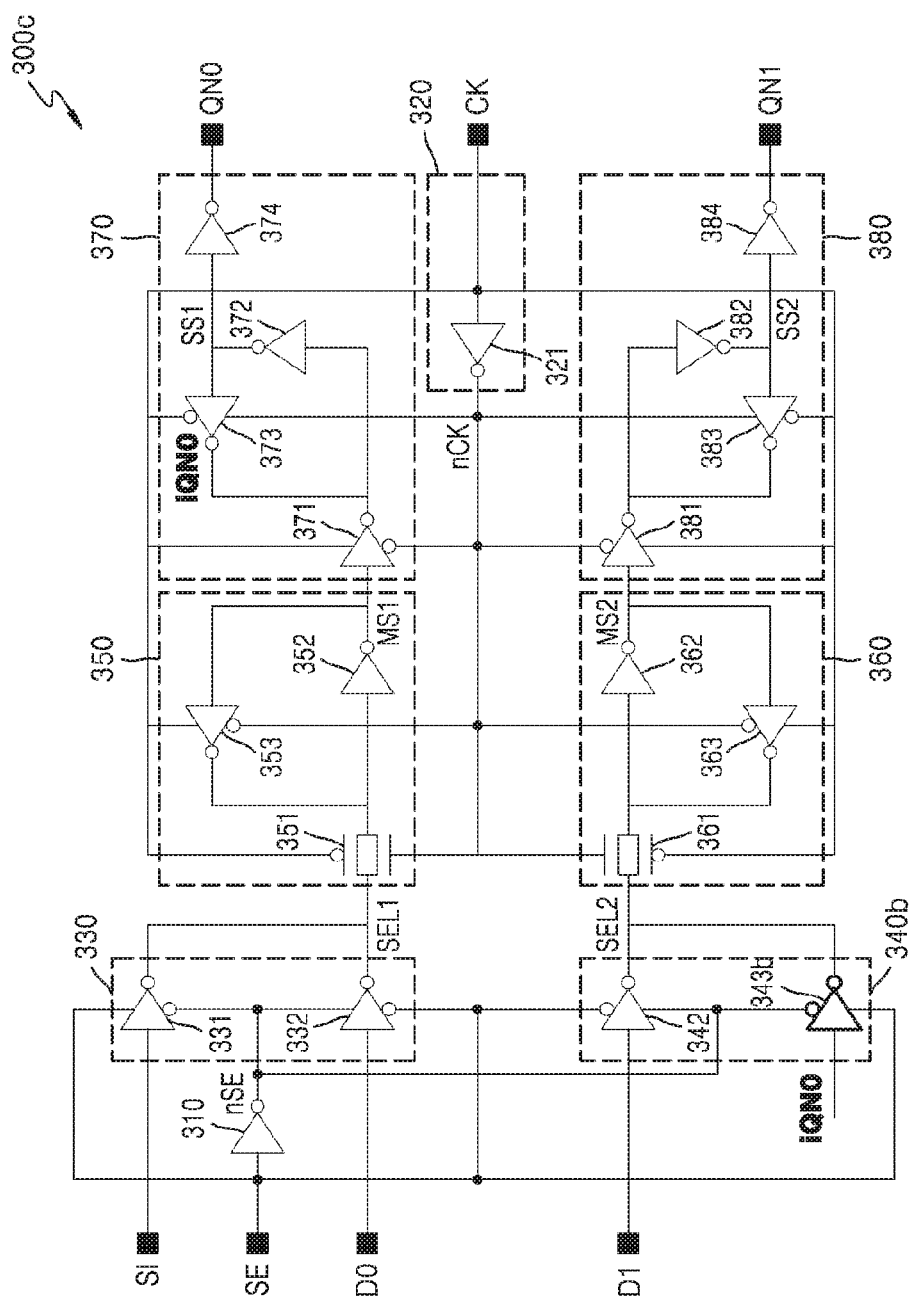

FIG. 21 is a circuit diagram of a multi-bit flip-flop 300c corresponding to an example of multi-bit flip-flop 300B of FIG. 18.

Referring to FIG. 21, multi-bit flip-flop 300c may include scan enable buffer 310, clock buffer 320, first and second input blocks 330 and 340b, first and second master latches 350 and 360, and first and second slave latches 370 and 380. Multi-bit flip-flop 300c corresponds to a modified embodiment of multi-bit flip-flop 300a of FIG. 19. Compared to multi-bit flip-flop 300a of FIG. 19, the configuration of second input block 340b of multi-bit flip-flop 300c may be different from that of second input block 340 of multi-bit flip-flop 300a.

In the present embodiment, second input block 340b may include a third input tri-state inverter 342 and a fourth input tri-state inverter 343b. Second input block 340b may include fourth input tri-state inverter 343b to transmit an internal negative signal iQN0 to second master latch 360, and may invert the internal negative signal iQN0 and transmit an inverted internal negative signal to second master latch 360. Accordingly, when a scan enable signal SE indicates a scan test mode, multi-bit flip-flop 300c inverts the internal negative signal iQN0, and thus, the polarity of a second negative output signal QN1 may be different from that of the internal negative signal iQN0. In the present embodiment, since the polarity of a scan input signal SI is different from that of the internal negative signal iQN0, the polarity of the scan input signal SI may be the same as that of the second negative output signal QN1.

Figure 22:
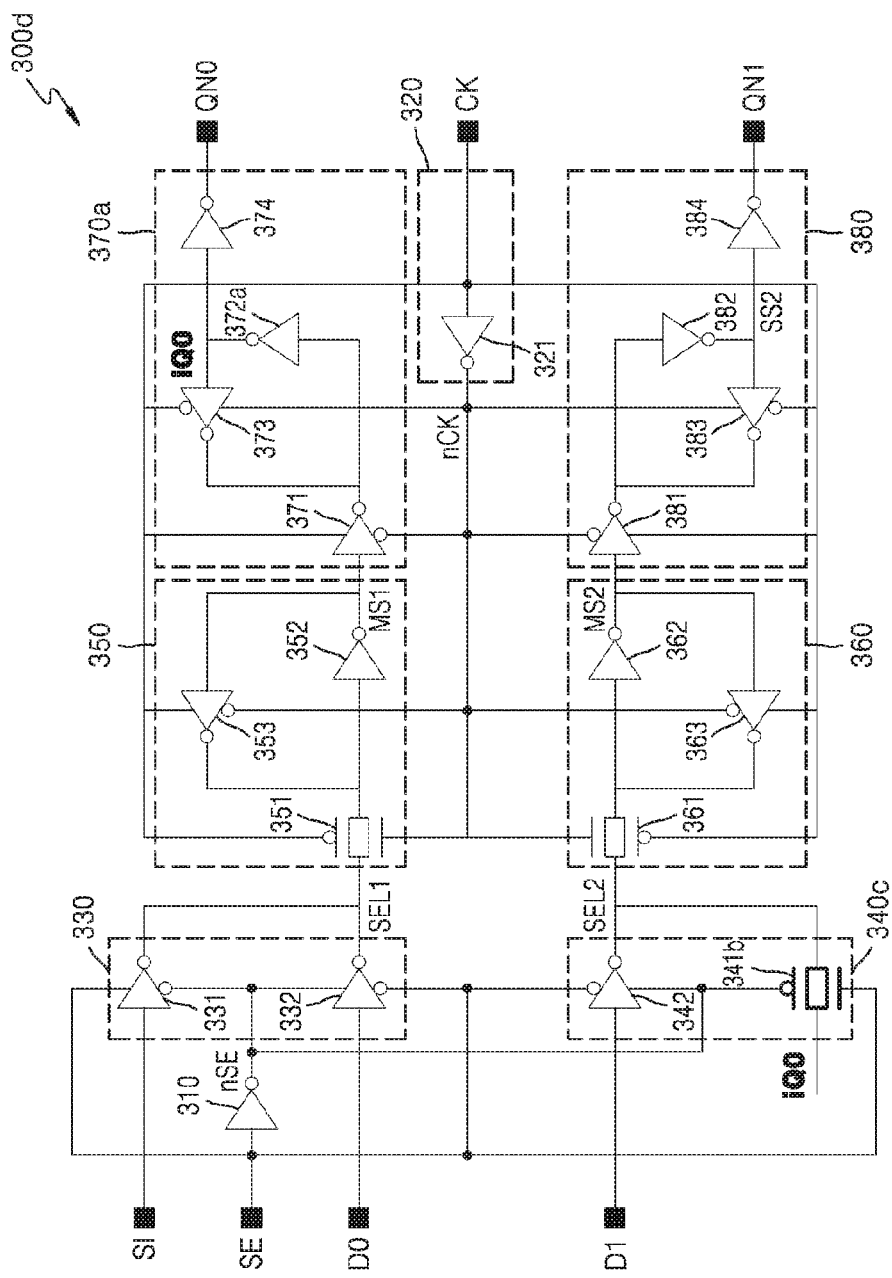

FIG. 22 is a circuit diagram of a multi-bit flip-flop 300d corresponding to an example of multi-bit flip-flop 300B of FIG. 18.

Referring to FIG. 22, multi-bit flip-flop 300d may include scan enable buffer 310, clock buffer 320, first and second input blocks 330 and 340c, first and second master latches 350 and 360, and first and second slave latches 370a and 380. Multi-bit flip-flop 300d corresponds to a modified embodiment of multi-bit flip-flop 300a of FIG. 19. Compared to multi-bit flip-flop 300a of FIG. 19, a method of generating an internal signal iQ0 in first slave latch 370a of multi-bit flip-flop 300d may be different from that in first slave latch 370 of multi-bit flip-flop 300a, and the configuration of second input block 340c of multi-bit flip-flop 300d may be different from that of second input block 340 of multi-bit flip-flop 300a.

In the present embodiment, first slave latch 370a may include first transmission tri-state inverter 371, second inverter 372a, second tri-state inverter 373, and third inverter 374. First transmission tri-state inverter 371 may output a signal obtained by inverting a first master signal MS1 in response to a clock signal CK and an inverted clock signal nCK. Second inverter 372a may invert an output of first transmission tri-state inverter 371. Second tri-state inverter 373 may receive an output of second inverter 372a, and may output a signal obtained by inverting an output of second inverter 372a in response to the clock signal CK and the inverted clock signal nCK. Third inverter 374 may invert the output of second inverter 372a and provide a first negative output signal QN0.

In the present embodiment, the output of second inverter 372a may be an input of third inverter 374, and the first negative output signal QN0 may be an output of third inverter 374. Accordingly, the output of second inverter 372a may have a logic level that is opposite to the logic level of an output of third inverter 374, that is, the first negative output signal QN0. Hereinafter, an output signal iQ0 of second inverter 372a is referred to as an internal signal iQ0 corresponding to the first negative output signal QN0. However, the inventive concept is not limited thereto, and a signal obtained through odd number of inverters from the first negative output signal QN0 may be used as the internal signal iQ0.

In the present embodiment, the polarity of a scan input signal SI and the polarity of the internal signal iQ0 may be the same as each other. In the present embodiment, the internal signal iQ0 that is the output signal of second inverter 372a may be used as a scan input signal that is applied to second input block 340c. Accordingly, a scan path passing through first input block 330, first master latch 350, and first slave latch 370a may be connected to a scan path passing through second input block 340c, second master latch 360, and second slave latch 380.

In the present embodiment, second input block 340c may include a second input transmission gate 341b and a third input tri-state inverter 342. Second input transmission gate 341b may receive the internal signal iQ0 corresponding to the first negative output signal QN0, and may invert the received internal signal iQ0 in response to a scan enable signal SE and an inverted scan enable signal nSE. Third input tri-state inverter 342 may receive a second data input signal D1, and may output a signal obtained by inverting the second data input signal D1, in response to the scan enable signal SE and the inverted scan enable signal nSE. In this case, a second selection signal SEL2 may be one selected from an output of second input transmission gate 341b and an output of third input tri-state inverter 342, depending on the scan enable signal SE.

Second input block 340c may include second input transmission gate 341b to transmit the internal signal iQ0 to second master latch 360, and may transmit the internal signal iQ0 to second master latch 360 without performing an inverting operation on the internal signal iQ0. Accordingly, when a scan enable signal SE indicates a scan test mode, multi-bit flip-flop 300d does not invert the internal signal iQ0, and thus, the polarity of a second negative output signal QN1 may be the same as that of the internal signal iQ0. In the present embodiment, since the polarity of the scan input signal SI is the same as that of the internal signal iQ0, the polarity of the second negative output signal QN1 may be the same as that of the scan input signal SI.

While the inventive concept has been particularly shown and described with reference to embodiments thereof, it will be understood that various changes in form and details may be made therein without departing from the spirit and scope of the following claims.

What is claimed is:

1. A multi-bit flip-flop, comprising:
   a single scan input pin configured to receive a scan input signal;
   a first data input pin configured to receive a first data input signal;
   a second data input pin configured to receive a second data input signal;
   a first scan flip-flop configured to select one of the scan input signal and the first data input signal as a first selection signal in response to a scan enable signal, and to latch the first selection signal to provide a first output signal;
   a second scan flip-flop configured to select one of an internal signal corresponding to the first output signal and the second data input signal as a second selection signal in response to the scan enable signal, and to latch the second selection signal to provide a second output signal;
   a first output pin configured to output the first output signal; and
   a second output pin configured to output the second output signal,
   wherein scan paths of the first and second scan flip-flops are connected to each other, and when the scan enable signal indicates a scan test mode, the second output signal corresponding to the scan input signal is output through the second output pin, and
   wherein the first scan flip-flop comprises:
   a master latch configured to latch the first selection signal; and
   a slave latch configured to provide the first output signal and the internal signal based on an output of the master latch,
   wherein the slave latch comprises:
   a transmission device configured to transmit or invert the output of the master latch;
   a first inverter having a first input terminal connected to an output terminal of the transmission device, and also having a first output terminal; and
   a second inverter having a second input terminal connected to the first output terminal of the first inverter, and also having a second output terminal connected to the first input terminal of the first inverter, and wherein an output of the second inverter or an output of the first inverter is used as the internal signal, and the internal signal is used as a second scan input signal for the second scan flip-flop when the scan enable signal indicates the scan test mode.

2. The multi-bit flip-flop of claim 1, wherein the internal signal is a signal obtained by mirroring the first output signal.

3. The multi-bit flip-flop of claim 1, wherein the first scan flip-flop generates a signal, which has a same logic level as the first output signal, as the internal signal and provides the internal signal to the second scan flip-flop.

4. The multi-bit flip-flop of claim 1, wherein the first scan flip-flop generates a signal, which has a logic level corresponding to an inversion of a logic level of the first output signal, as the internal signal and provides the internal signal to the second scan flip-flop.

5. The multi-bit flip-flop of claim 1, further comprising a clock buffer configured to receive a clock signal, to buffer the received clock signal, and to drive the first and second scan flip-flops,
wherein the multi-bit flip-flop is implemented with a single cell.

6. The multi-bit flip-flop of claim 5, wherein the clock buffer comprises:
a first clock inverter configured to invert the clock signal and to output an inverted clock signal; and
a second clock inverter configured to invert the inverted clock signal and to output a buffered clock signal.

7. The multi-bit flip-flop of claim 5, wherein the clock buffer comprises a clock inverter configured to invert the clock signal and to output an inverted clock signal.

8. The multi-bit flip-flop of claim 1, wherein the slave latch comprises a tri-state inverter configured to invert the output of the master latch in response to a clock signal.

9. The multi-bit flip-flop of claim 1, wherein a polarity of the scan input signal is same as a polarity of the first output signal.

10. The multi-bit flip-flop of claim 1, wherein a polarity of the scan input signal is different from a polarity of the first output signal.

11. A multi-bit flip-flop, comprising:
a single negative scan input pin configured to receive a negative scan input signal;
a first data input pin configured to receive a first data input signal;
a second data input pin configured to receive a second data input signal;
a first scan flip-flop configured to select one of an internal scan input signal and the first data input signal as a first selection signal in response to a scan enable signal, and to latch the first selection signal to provide a first negative output signal;
a second scan flip-flop configured to select one of an internal signal corresponding to the first negative output signal and the second data input signal as a second selection signal in response to the scan enable signal, and to latch the second selection signal to provide a second negative output signal;
a first negative output pin configured to respectively output the first negative output signal; and
a second negative output pin configured to output the second negative output signal,
wherein scan paths of the first and second scan flip-flops are connected to each other, and when the scan enable signal indicates a scan test mode, the second negative output signal corresponding to the negative scan input signal is output through the second negative output pin,
wherein the first scan flip-flop comprises:
a master latch configured to latch the first selection signal; and
a slave latch configured to provide the first output signal and the internal signal based on an output of the master latch,
wherein the slave latch comprises:
a transmission device configured to transmit or invert the output of the master latch;
a first inverter having a first input terminal connected to an output terminal of the transmission device, and also having a first output terminal; and
a second inverter having a second input terminal connected to the first output terminal of the first inverter, and also having a second output terminal connected to the first input terminal of the first inverter, and
wherein an output of the second inverter or an output of the first inverter is used as the internal signal, and the internal signal is used as a scan input signal for the second scan flip-flop when the scan enable signal indicates the scan test mode.

12. A multi-bit flip-flop, comprising:
a first scan flip-flop configured to select one of a scan input signal and a first data input signal as a first selection signal in response to a scan enable signal, and to latch the first selection signal to provide a first output signal; and
a second scan flip-flop configured to select one of an internal signal corresponding to the first output signal and a second data input signal as a second selection signal in response to the scan enable signal, and to latch the second selection signal to provide a second output signal,
wherein data paths of the first and second scan flip-flops are separated from each other, and scan paths of the first and second scan flip-flops are connected to each other,
wherein the first scan flip-flop comprises:
a master latch configured to latch the first selection signal; and
a slave latch configured to provide the first output signal and the internal signal based on an output of the master latch,
wherein the slave latch comprises:
a transmission device configured to transmit or invert the output of the master latch;
a first inverter having a first input terminal connected to an output terminal of the transmission device, and also having a first output terminal; and
a second inverter having a second input terminal connected to the first output terminal of the first inverter, and also having a second output terminal connected to the first input terminal of the first inverter,
wherein an output of the second inverter is used as the internal signal, and
wherein the internal signal is used as a second scan input signal for the second scan flip-flop when the scan enable signal indicates a scan test mode.

13. A multi-bit flip-flop, comprising:
a first scan flip-flop configured to receive a first data input signal and to receive a scan input signal, and to latch a first output signal which is responsive to a first selected one of the first data input signal and the scan input signal, wherein the first scan flip-flop is configured to select the first selected one of the first data input signal and the scan input signal in response to a scan enable signal; and a second scan flip-flop configured to receive a second data input signal and to receive an internal signal corresponding to the first output signal, and to latch a second output signal which is responsive to a second selected one of the second data input signal and the internal signal corresponding to the first output signal, wherein the second scan flip-flop selects the second selected one of the second data input signal and the internal signal corresponding to the first output signal in response to the scan enable signal, wherein the first scan flip-flop comprises:
  a master latch configured to latch the first selection signal; and
  a slave latch configured to provide the first output signal and the internal signal based on an output of the master latch, wherein the slave latch comprises:
  a transmission device configured to transmit or invert the output of the master latch;
  a first inverter having a first input terminal connected to an output terminal of the transmission device and a first output terminal; and
  a second inverter having a second input terminal connected to the first output terminal of the first inverter, and also having a second output terminal connected to the first input terminal of the first inverter, wherein an output of the first inverter is used as the internal signal, and wherein the internal signal is used as a second scan input signal for the second scan flip-flop when the scan enable signal indicates a scan test mode.

14. The multi-bit flip-flop of claim 1, wherein the second scan flip-flop comprises:
  an input block including a third inverter configured to receive the second data input signal and a fourth inverter configured to receive the internal signal.

15. The multi-bit flip-flop of claim 14, wherein the second scan flip-flop is further configured to select an output of the fourth inverter when the scan enable signal indicates the scan test mode.

16. The multi-bit flip-flop of claim 11, wherein the second scan flip-flop comprises:
  an input block including a third inverter configured to receive the second data input signal and a fourth inverter configured to receive the internal signal.

17. The multi-bit flip-flop of claim 16, wherein the second scan flip-flop is further configured to select an output of the fourth inverter when the scan enable signal indicates the scan test mode.

18. The multi-bit flip-flop of claim 12, wherein the second scan flip-flop comprises:
  an input block including a third inverter configured to receive the second data input signal and a fourth inverter configured to receive the internal signal.

19. The multi-bit flip-flop of claim 18, wherein the second scan flip-flop is further configured to select an output of the fourth inverter when the scan enable signal indicates the scan test mode.

20. The multi-bit flip-flop of claim 13, wherein the second scan flip-flop comprises:
  an input block including a third inverter configured to receive the second data input signal and a fourth inverter configured to receive the internal signal.

* * * * *